(12) United States Patent
Campbell et al.

(10) Patent No.: US 9,420,721 B2
(45) Date of Patent: Aug. 16, 2016

(54) LIQUID-COOLED HEAT SINK ASSEMBLIES

(71) Applicant: INTERNATIONAL BUSINESS MACHINES CORPORATION, Armonk, NY (US)

(72) Inventors: Levi A. Campbell, Poughkeepsie, NY (US); Milnes P. David, Fishkill, NY (US); Dustin W. Demetriou, Poughkeepsie, NY (US); Michael J. Ellsworth, Jr., Poughkeepsie, NY (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/828,775

(22) Filed: Aug. 18, 2015

(65) Prior Publication Data
US 2016/0143184 A1    May 19, 2016

Related U.S. Application Data

(63) Continuation of application No. 14/546,159, filed on Nov. 18, 2014.

(51) Int. Cl.
*H05K 7/20* (2006.01)
*H01L 23/34* (2006.01)
*H01L 23/473* (2006.01)

(52) U.S. Cl.
CPC ........ *H05K 7/20218* (2013.01); *H05K 7/20254* (2013.01); *H05K 7/20436* (2013.01); *H01L 23/34* (2013.01); *H01L 23/473* (2013.01); *H05K 7/20281* (2013.01); *H05K 7/20509* (2013.01)

(58) Field of Classification Search
CPC .......... H05K 7/20218; H05K 7/20436; H05K 7/20254; H01L 23/367; H01L 23/34; H01L 23/36; H01L 23/373; H01L 23/473; H01L 23/427; H01L 23/3675; H01L 23/38; H01L 21/4871; H01L 2225/06589; H01L 33/64
See application file for complete search history.

(56) References Cited

U.S. PATENT DOCUMENTS

| 4,538,171 A | 8/1985 | Stevens et al. |
| 4,750,031 A | 6/1988 | Miller et al. |

(Continued)

FOREIGN PATENT DOCUMENTS

| CN | 2013-83909 Y | 1/2010 |
| JP | 2006-339403 A | 12/2006 |

(Continued)

OTHER PUBLICATIONS

Campbell et al., International Search Report & Written Opinion for PCT Application No. PCT/IB2015/058394, dated Jan. 26, 2016 (8 pages).

(Continued)

*Primary Examiner* — Julio J Maldonado
*Assistant Examiner* — Farun Lu
(74) *Attorney, Agent, or Firm* — Steven Chiu, Esq.; Kevin P. Radigan, Esq.; Heslin Rothenberg Farley & Mesiti P.C.

(57) ABSTRACT

Liquid-cooled heat sink assemblies are provided which include: a thermally conductive base structure having a sidewall surface and a main heat transfer surface; and a manifold structure attached to the base structure, with the base structure residing at least in part within a recess in the manifold structure. Together, the base and manifold structures define a coolant-carrying compartment through which liquid coolant flows, at least in part, in a direction substantially parallel to the main heat transfer surface of the base structure, and at least one of the sidewall surface of the thermally conductive base structure or an opposing surface thereto of the manifold structure includes a continuous groove. A sealing member is disposed, at least in part, within the continuous groove, and provides a fluid-tight seal between the thermally conductive base structure and the manifold structure.

12 Claims, 12 Drawing Sheets

(56) References Cited

U.S. PATENT DOCUMENTS

| | | | |
|---|---|---|---|
| 5,660,758 | A | 8/1997 | McCullough |
| 6,085,785 | A | 7/2000 | Smith, III |
| 6,141,219 | A | 10/2000 | Downing et al. |
| 6,547,210 | B1 | 4/2003 | Marx et al. |
| 6,778,393 | B2 | 8/2004 | Messina et al. |
| 6,826,054 | B2 | 11/2004 | Liu |
| 6,892,801 | B1 | 5/2005 | Kim |
| 7,092,255 | B2 | 8/2006 | Barson et al. |
| 7,450,378 | B2 | 11/2008 | Nelson et al. |
| 7,486,514 | B2 | 2/2009 | Campbell et al. |
| 7,518,233 | B1 | 4/2009 | Takahashi et al. |
| 7,751,918 | B2 | 7/2010 | Campbell et al. |
| 2007/0069420 | A1 | 3/2007 | Kozyra et al. |
| 2008/0210405 | A1* | 9/2008 | Datta ............... F04B 17/00 165/102 |
| 2008/0296256 | A1 | 12/2008 | Panek |
| 2010/0328882 | A1 | 12/2010 | Campbell et al. |
| 2012/0327603 | A1 | 12/2012 | Beaupre et al. |

FOREIGN PATENT DOCUMENTS

| | | |
|---|---|---|
| JP | 2009-206271 A | 9/2009 |
| JP | 2011-108141 A | 6/2011 |

OTHER PUBLICATIONS

Campbell et al., Notice of Allowance for U.S. Appl. No. 14/546,159, filed Nov. 18, 2014, dated Feb. 22, 2016 (13 pages).

Anonymous, "Method for an LGA Package Socket Assembly with a Threaded Socket Cap and Integrated Load Ring", IP.com, IPCOM000019059D, published Aug. 27, 2003 (5 pages).

Campbell et al., "Composite Heat Sink Structures", U.S. Appl. No. 14/546,136, filed Nov. 18, 2014 (59 pages).

Campbell et al., "Liquid-Cooled Heat Sink Assemblies", U.S. Appl. No. 14/546,159, filed Nov. 18, 2014 (52 pages).

Campbell et al., "Composite Heat Sink Structures", U.S. Appl. No. 14/828,767, filed Aug. 18, 2015 (57 pages).

Campbell et al., "List of IBM Patents or Patent Applications Treated As Related" for U.S. Appl. No. 14/828,775, filed Aug. 18, 2015 (2 pages).

* cited by examiner

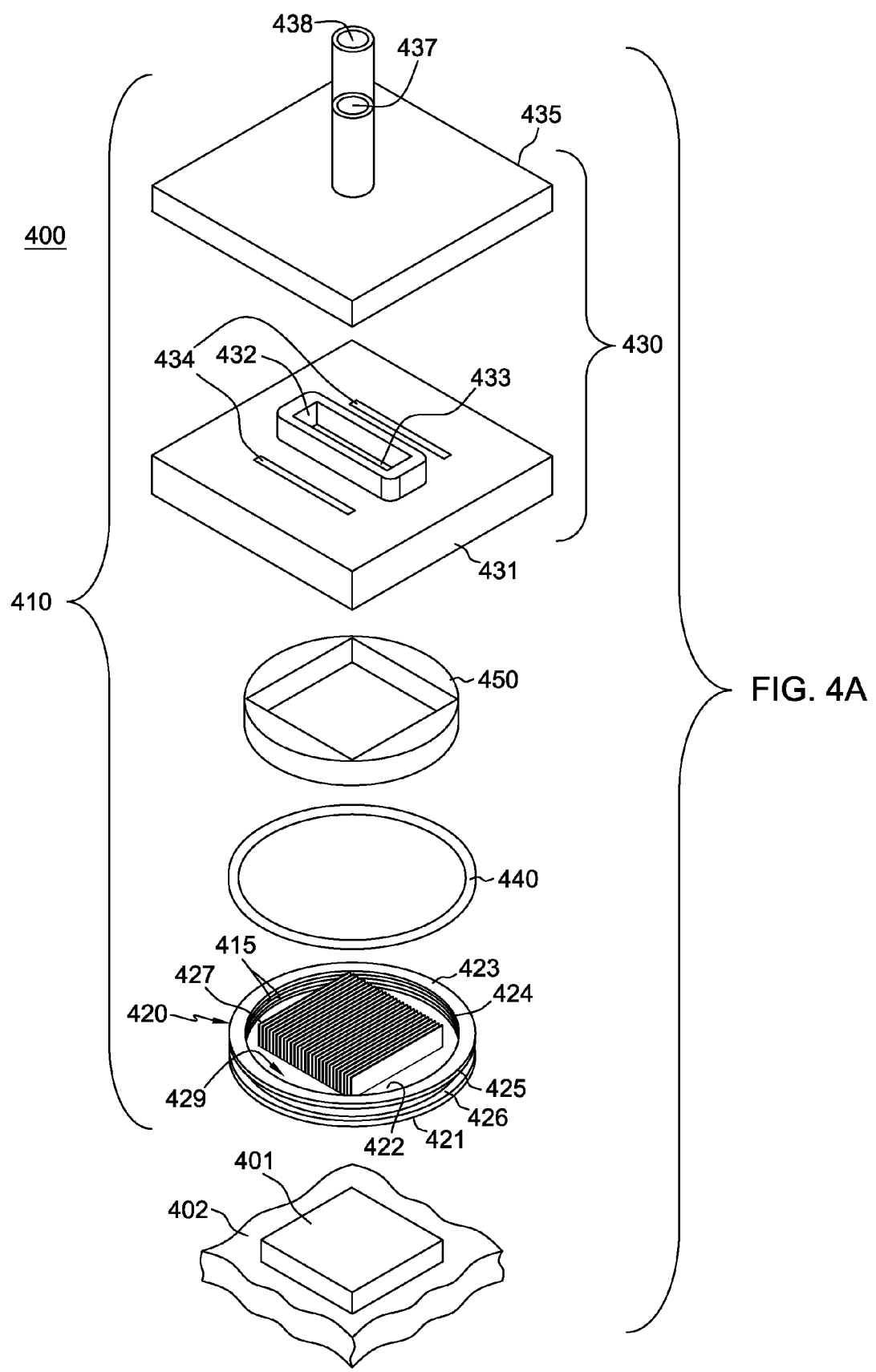

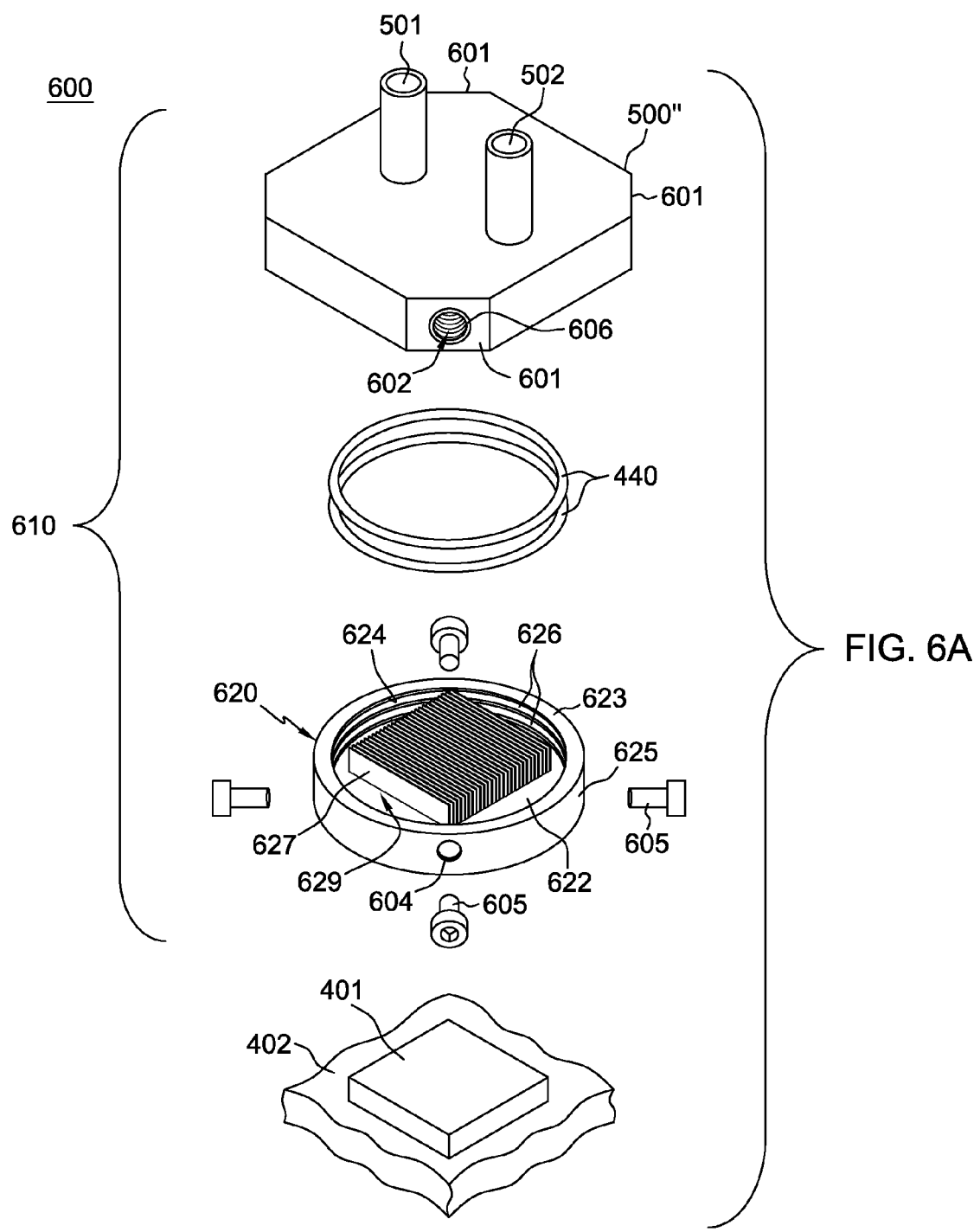

US 9,420,721 B2

LIQUID-COOLED HEAT SINK ASSEMBLIES

BACKGROUND

As is known, operating electronic components produce heat, which should be removed in an effective manner in order to maintain device junction temperatures within desirable limits, with failure to do so resulting in excessive component temperatures, potentially leading to thermal runaway conditions. Several trends in the electronics industry have combined to increase the importance of thermal management, including in technologies where thermal management has traditionally been less of a concern, such as complementary metal oxide semiconductor (CMOS) technologies. In particular, the need for faster and more densely packed circuits has had a direct impact on the importance of thermal management. For instance, power dissipation, and therefore heat production, increases as device operating frequencies increase. Also, increased operating frequencies may be possible at lower device junction temperatures. Further, as more and more components are packed onto a single chip, heat flux (Watts/cm$^2$) increases, resulting in the need to dissipate more power from a given size chip, module, or system. These trends have combined to create applications where traditional air cooling methods alone, such as methods using air cooled heat sinks with heat pipes or vapor chambers, are unable to remove sufficient heat.

The need to cool current and future high heat load, high heat flux electronic components thus mandates the continued development of more aggressive thermal management techniques using, for instance, liquid cooling. Various types of liquid coolants and liquid-cooling approaches are known, and provide different cooling capabilities. For instance, fluids such as refrigerants or other dielectric liquids (e.g., fluorocarbon liquids) exhibit lower thermal conductivity and specific heat properties, compared to liquids such as water or other aqueous fluids, but may be placed in direct physical contact with electronic components and their associated interconnects without adverse effects, such as corrosion or electrical short circuits. Other cooling liquids, such as water or other aqueous fluids, exhibit superior thermal conductivity and specific heat compared to dielectric fluids. However, water-based coolants must be separated from physical contact with the electronic components and interconnects, since corrosion and electrical short circuit problems are otherwise likely to result. This is typically accomplished by flowing the liquid coolant through a liquid-cooled heat sink or cold plate.

Various liquid-cold heat sink configurations have been disclosed in the art. Typically, a liquid-cooled heat sink is a thermally conductive structure, being fabricated completely of metal, and having one or more channels or passageways formed within the heat sink for flowing liquid coolant through the heat sink. Examples of such heat sinks are disclosed in commonly assigned, U.S. Letters Pat. No. 7,751,918 B2, issued Jul. 6, 2010. Although very effective, such all-metal, liquid-cooled heat sinks could be relatively expensive to fabricate, as well as be relatively heavy, depending on the size of the electronic component(s) or assembly to be cooled. Thus, addressed herein, in part, is a goal of lowering heat sink assembly costs, and providing lighter-weight heat sink structures for facilitating cooling of one or more electronic components of an electronic system.

SUMMARY

Provided herein, in one or more aspects, is a method which includes providing a liquid-cooled heat sink assembly to cool at least one component. The providing of the liquid-cooled heat sink assembly includes: providing a thermally conductive base structure having a sidewall surface and a main heat transfer surface, the main heat transfer surface to couple to the at least one component to be cooled; providing a manifold structure attached to the thermally conductive base structure, with the thermally conductive base structure residing at least partially within a recess in a manifold structure, the manifold structure and the thermally conductive base structure together defining a coolant-carrying compartment through which liquid-coolant flows, at least in part, in a direction substantially parallel to the main heat transfer surface of the thermally conductive base structure, wherein at least one of the sidewall surface of the thermally conductive base structure or an opposing surface thereto of the manifold structure comprises a continuous groove; and providing a sealing member disposed, at least in part, within the continuous groove, the sealing member providing a fluid-tight seal between the thermally conductive base structure and the manifold structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 4A depicts an exploded view of one embodiment of an apparatus comprising at least one electronic component to be cooled, and a liquid-cooled heat sink assembly, in accordance with one or more aspects of the present invention;

FIG. 6A depicts an exploded view of a further embodiment of an apparatus comprising one or more electronic components to be cooled, and a liquid-cooled heat sink assembly, in accordance with one or more aspects of the present invention;

DETAILED DESCRIPTION

Figure 1:
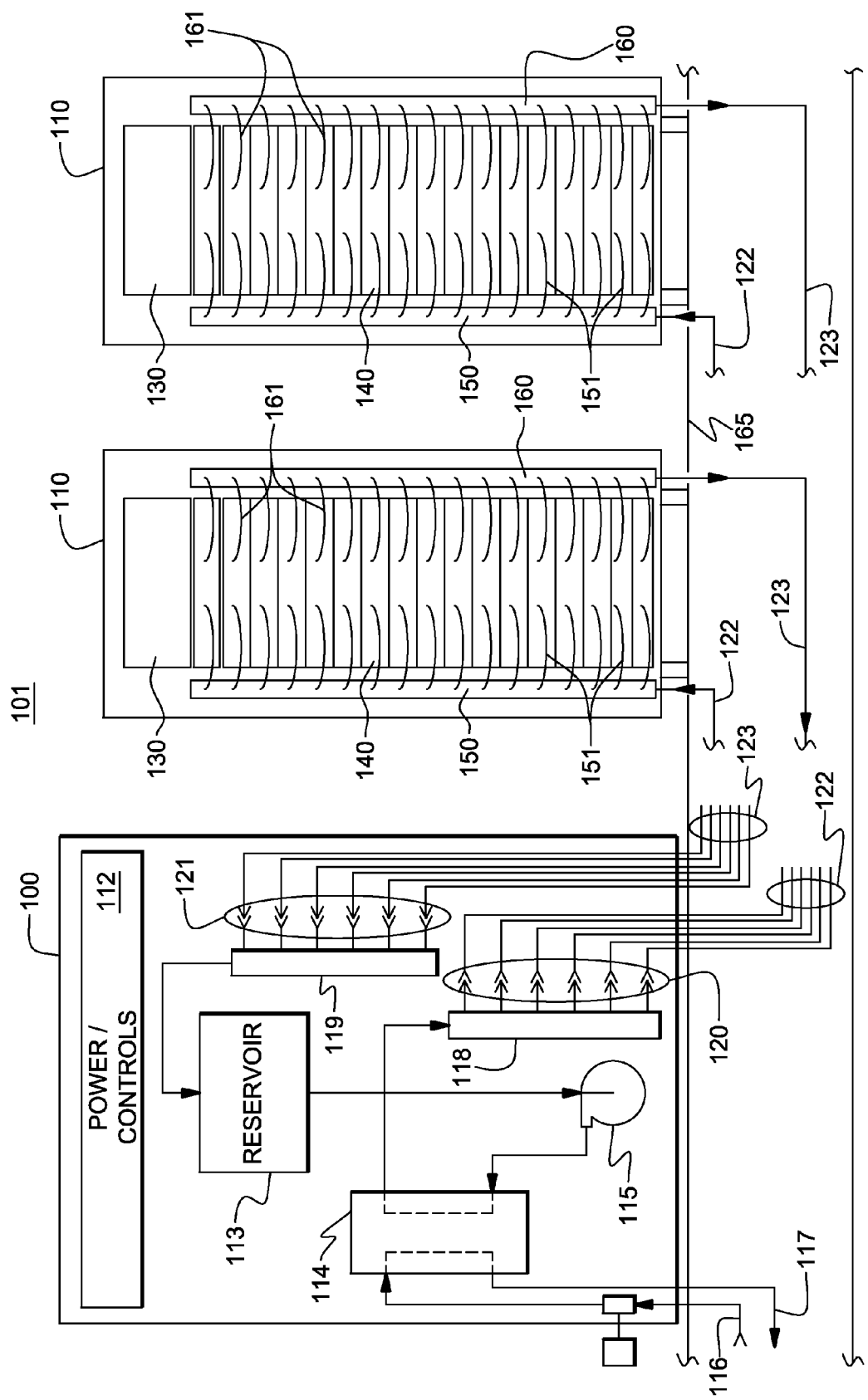
FIG. 1 depicts one embodiment of a liquid-cooled data center comprising a coolant distribution unit which facilitates liquid-cooling of electronics racks of the data center, in accordance with one or more aspects of the present invention.

As used herein, the terms "electronics rack" and "rack unit" are used interchangeably, and unless otherwise specified include any housing, frame, rack, compartment, blade server system, etc., having one or more heat-generating components of a computer system, electronic system, or information technology equipment, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system within an electronics rack may be movable or fixed relative to the electronics rack, with rack-mounted electronic drawers being one example of electronic systems of an electronics rack to be cooled.

"Electronic component" refers to any heat-generating electronic component of, for example, a computer system or other electronics unit requiring cooling. By way of example, an electronic component may comprise one or more packaged or unpackaged integrated circuit die (or chips), such as processor chips, and/or other electronic devices to be cooled, including one or more memory chips, memory support chips, etc.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of the coolants discussed herein, such as the facility coolant or system coolant, is water. However, the cooling concepts disclosed below are readily adapted to use with other types of coolant on the facility side and/or on the system side. For example, one or more of the coolants may comprise an aqueous-based liquid, such as a brine, or a dielectric liquid, such as a fluorocarbon liquid, a hydrofluoroether liquid, a liquid metal, or other similar coolant, or refrigerant, while still maintaining the advantages and unique features of the present invention.

Reference is made below to the drawings, which are not drawn to scale for ease of understanding, where the same or similar reference numbers used throughout different figures designate the same or similar components.

In one embodiment, an air-cooled data center may have a raised floor layout, where multiple electronics racks are disposed in one or more rows. Such a data center may house several hundred, or even several thousand microprocessors. In one implementation, chilled air enters the computer room via perforated floor tiles from a supply air plenum defined between the raised floor and a base or sub-floor of the room. Cooled air is taken in through louvered covers at air inlet sides of the electronics racks and expelled through the back (i.e., air outlet sides) of the electronics racks. The electronics racks may have one or more air moving devices (e.g., axial or centrifugal fans) to provide forced inlet-to-outlet airflow to cool the electronic components within the system(s) of the rack. The supply air plenum provides cooled air to the air-inlet sides of the electronics racks via perforated floor tiles disposed in a "cold" aisle of the data center. The cooled air is supplied to the under-floor plenum by one or more computer room air-conditioning (CRAC) units, also disposed within the data center. Room air is taken into each air-conditioning unit typically near an upper portion thereof. This room air may comprise in part exhausted air from the "hot" aisles of the data center defined, for example, by opposing air outlet sides of the electronics racks.

Figure 2:
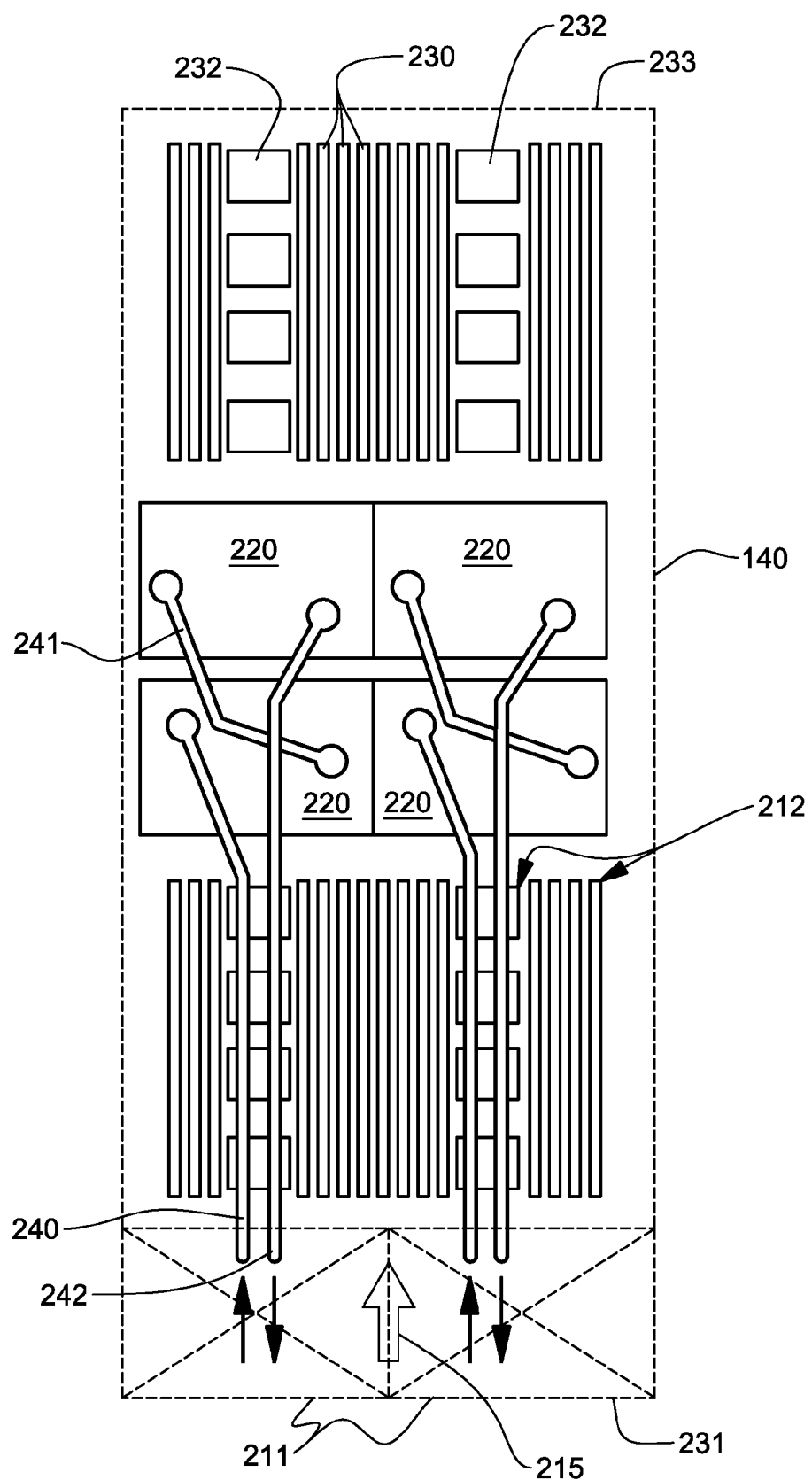
FIG. 2 is a plan view of one embodiment of an electronic system (or node) layout illustrating an air and liquid cooling apparatus for cooling components of the electronic system, in accordance with one or more aspects of the present invention.
Figure 3:
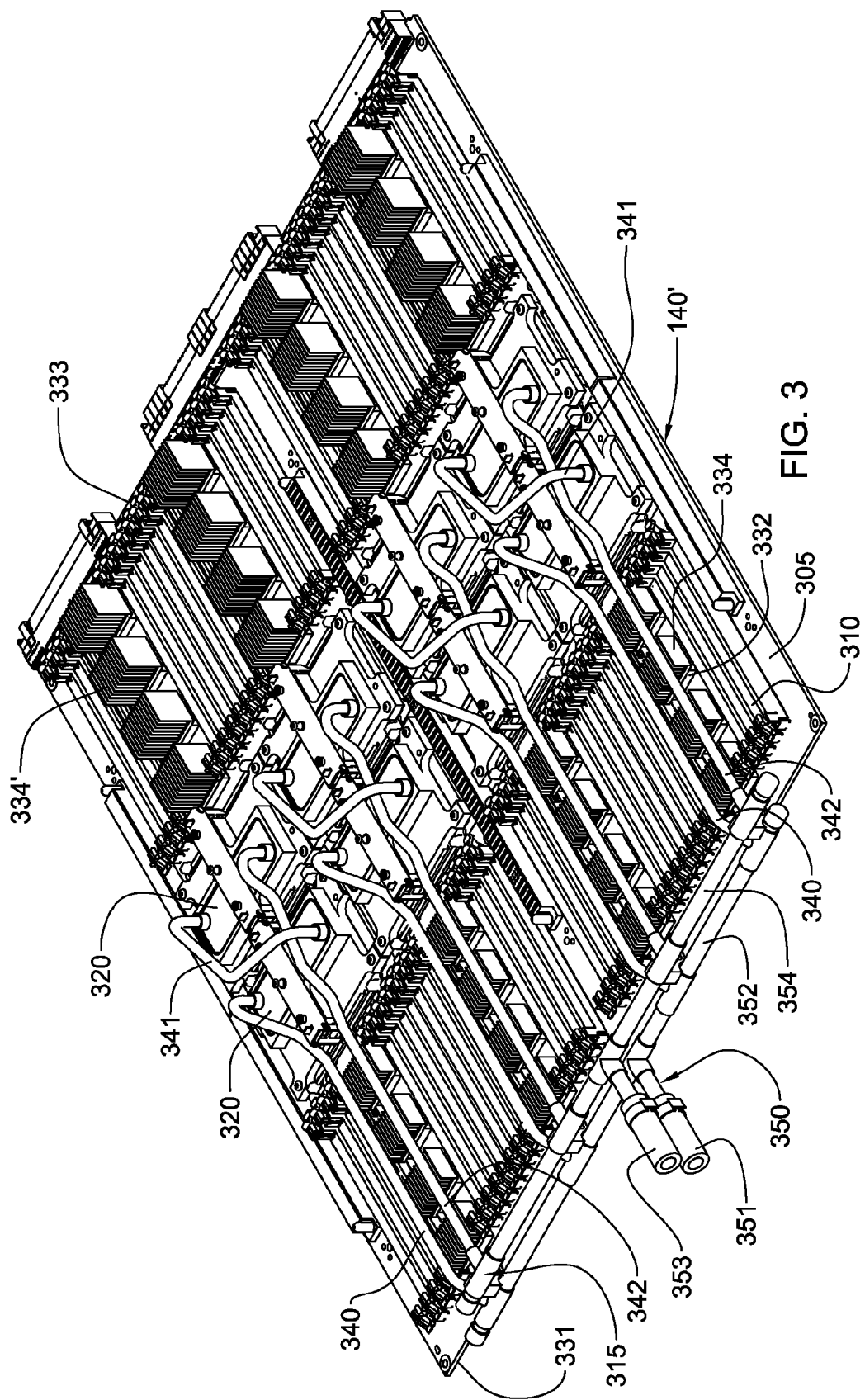
FIG. 3 depicts one detailed embodiment of a partially assembled electronic system layout, wherein the electronic system includes eight heat-generating electronic components to be cooled, each having, in one embodiment, a respective cooling apparatus associated therewith, in accordance with one or more aspects of the present invention.

Due to the ever-increasing airflow requirements through electronics racks, and the limits of air distribution within the typical data center installation, liquid-based cooling may be combined with, or used in place of, conventional air-cooling. FIGS. 1-3 illustrate one embodiment of a data center implementation employing a liquid-based cooling system with one or more liquid-cooled heat sinks coupled to high heat-generating electronic components disposed within one or more electronics racks.

Referring first to FIG. 1, one embodiment of a data center 101 comprising a coolant distribution unit 100, is depicted. The coolant distribution unit may be a relatively large unit which occupies what would be considered a full electronics frame. Within coolant distribution unit 100 is a power/control element 112, a reservoir/expansion tank 113, a heat exchanger 114, a pump 115 (possibly accompanied by a redundant second pump), facility coolant inlet 116 and outlet 117 supply pipes, a supply manifold 118 supplying system coolant to the electronics racks 110 via couplings 120 and lines 122, and a return manifold 119 receiving system coolant from the electronics racks 110, via lines 123 and couplings 121. The electronics racks may include (in one example) a power/control unit 130 for the rack, multiple electronic systems 140, a system coolant supply manifold 150, and a system coolant return manifold 160. As shown, the electronics racks 110 may be disposed on a raised floor 165 of the data center 101, with lines 122 providing system coolant to system coolant supply manifolds 150 and lines 123 facilitating return of system coolant from system coolant return manifolds 160 being disposed in the supply air plenum beneath the raised floor.

In the embodiment illustrated, the system coolant supply manifold 150 provides system coolant to the cooling systems of the electronic systems (such as to liquid-cooled heat sinks thereof) via flexible hose connections 151, which are disposed between the supply manifold and the respective electronic systems within the rack. Similarly, system coolant return manifold 160 is coupled to the electronic systems via flexible hose connections 161. Quick connect couplings may be employed at the interface between flexible hoses 151, 161 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed, for instance, at an air outlet side thereof, which also receives system coolant from the system coolant supply manifold 150 and returns system coolant to the system coolant return manifold 160.

FIG. 2 depicts one embodiment of an electronic system 140 component layout, wherein one or more air moving devices 211 provide forced air flow 215 to cool multiple components 212 within electronic system 140. Cool air is taken in through a front 231 and exhausted out a back 233 of the system. The multiple components to be cooled include multiple processor modules to which liquid-cooled heat sinks 220 (of a liquid-based cooling system) are coupled, as well as multiple arrays of memory modules 230 (e.g., dual in-line memory modules (DIMMs)) and multiple rows of memory support modules 232 (e.g., DIMM control modules) to which air-cooled heat sinks may be coupled. In the embodiment illustrated, memory modules 230 and the memory support modules 232 are partially arrayed near front 231 of electronic system 140, and partially arrayed near back 233 of electronic system 140. Also, in the embodiment of FIG. 2, memory modules 230 and the memory support modules 232 are cooled by air flow 215 across the electronic system.

The illustrated liquid-based cooling system further includes multiple coolant-carrying tubes connected to and in fluid communication with liquid-cooled heat sinks 220. The coolant-carrying tubes comprise sets of coolant-carrying tubes, with each set including (for example) a coolant supply tube 240, a bridge tube 241 and a coolant return tube 242. By way of example only, the set of tubes provide liquid coolant to a series-connected pair of heat sinks 220 (coupled to a pair of processor modules). Coolant flows into a first heat sink of a pair via the coolant supply tube 240 and from the first heat sink to a second heat sink of the pair via bridge tube or line 241, which may or may not be thermally conductive. From the second heat sink of the pair, coolant is returned through the respective coolant return tube 242. Note that in an alternate implementation, one or more of the liquid-cooled heat sinks 220 could be coupled directly to a respective coolant supply tube 240 and coolant return tube 242, that is, without series connecting two or more of the liquid-cooled heat sinks.

By way of further explanation, FIG. 3 depicts an alternate electronic system layout comprising eight processor modules, each having a respective liquid-cooled heat sink of a liquid-based cooling system coupled thereto. The liquid-based cooling system is shown to further include associated coolant-carrying tubes for facilitating passage of liquid coolant through the liquid-cooled heat sinks and a header subassembly to facilitate distribution of liquid coolant to and return of liquid coolant from the liquid-cooled heat sinks By way of specific example, the liquid coolant passing through the liquid-based cooling subsystem may be cooled and conditioned (e.g., filtered) water.

FIG. 3 is an isometric view of one embodiment of an electronic system or drawer, and a cooling system. The depicted planar server assembly includes a multi-layer printed circuit board to which memory DIMM sockets and various electronic components to be cooled may be attached both physically and electrically. In the cooling system depicted, a supply header is provided to distribute liquid coolant from an inlet to multiple parallel coolant flow paths and a return header collects exhausted coolant from the multiple parallel coolant flow paths into an outlet. Each parallel coolant flow path may include one or more heat sinks in series flow arrangement to facilitate cooling one or more electronic components to which the heat sinks are coupled. The number of parallel paths and the number of series-connected liquid-cooled heat sinks may depend, for example, on the desired component temperature, available coolant temperature and coolant flow rate, and the total heat load being dissipated from the electronic components.

More particularly, FIG. 3 depicts one embodiment of a partially assembled electronic system 140' and an assembled liquid-based cooling system 315 coupled to primary heat-generating components (e.g., including processor die or electronic modules) to be cooled. In this embodiment, the electronic system is configured for (or as) a node of an electronics rack, and includes, by way of example, a support substrate or planar board 305, a plurality of memory module sockets 310 (with the memory modules (e.g., dual in-line memory modules) not shown), multiple rows of memory support modules 332 (each having coupled thereto an air-cooled heat sink 334), and multiple processor modules (not shown) disposed below the liquid-cooled heat sinks 320 of the liquid-based cooling system 315.

In addition to liquid-cooled heat sinks 320, liquid-based cooling system 315 includes multiple coolant-carrying tubes, including coolant supply tubes 340 and coolant return tubes 342 in fluid communication with respective liquid-cooled heat sinks 320. The coolant-carrying tubes 340, 342 are also connected to a header (or manifold) subassembly 350 which facilitates distribution of liquid coolant to the coolant supply tubes and return of liquid coolant from the coolant return tubes 342. In this embodiment, the air-cooled heat sinks 334 coupled to memory support modules 332 closer to front 331 of electronic system 140' are shorter in height than the air-cooled heat sinks 334' coupled to memory support modules 332 near back 333 of electronic system 313. This size difference is to accommodate the coolant-carrying tubes 340, 342 since, in the depicted embodiment, the header subassembly 350 is at the front 331 of the electronics system and the multiple liquid-cooled heat sinks 320 are in the middle.

Liquid-based cooling system 315 comprises, in one embodiment, a pre-configured monolithic structure which includes multiple (pre-assembled) liquid-cooled heat sinks 320 configured and disposed in spaced relation to engage respective heat-generating electronic components. Each liquid-cooled heat sink 320 includes, in one embodiment, a liquid coolant inlet and a liquid coolant outlet, as well as an attachment subassembly (i.e., a heat sink/load arm assembly). Each attachment subassembly is employed to couple its respective liquid-cooled heat sink 320 to the associated electronic component to form the heat sink and electronic component (or device) assemblies depicted. Alignment openings (i.e., thru-holes) may be provided on the sides of the heat sink to receive alignment pins or positioning dowels during the assembly process. Additionally, connectors (or guide pins) may be included within the attachment subassembly to facilitate use of the attachment assembly.

As shown in FIG. 3, header subassembly 350 may include two liquid manifolds, i.e., a coolant supply header 352 and a coolant return header 354, which in one embodiment, may be mechanically coupled together via supporting brackets. In a monolithic cooling structure example, the coolant supply header 352 may be metallurgically bonded in fluid communication to each coolant supply tube 340, while the coolant return header 354 is metallurgically bonded in fluid communication to each coolant return tube 352. By way of example, a single coolant inlet 351 and a single coolant outlet 353 extend from the header subassembly for coupling to the electronics rack's coolant supply and return manifolds, such as shown in FIG. 1.

In one embodiment only, the coolant supply tubes 340, bridge tubes 341 and coolant return tubes 342 in the exemplary embodiment of FIG. 3 may be pre-configured, semi-rigid tubes formed of a thermally conductive material, such as copper or aluminum, and the tubes may be respectively brazed, soldered or welded in a fluid-tight manner to the header subassembly and/or the liquid-cooled heat sinks. The tubes are pre-configured for a particular electronics system to facilitate installation of the monolithic structure in engaging relation with one or more selected components of the electronic system.

In one or more embodiments, the liquid-cooled heat sink(s) of a cooling system, such as described above, may be completely formed of a thermally conductive, metal material, such as copper or aluminum. While effective in assisting cooling of selected electronic components, existing metal-based designs of liquid-cooled heat sinks can be relatively expensive to produce, and heavy in implementation. Further, existing liquid-cooled heat sink configurations are often fabricated with a larger footprint than cooling requirements dictate, to allow space for attaching together the different components of the heat sink. Therefore, to address these issues, disclosed below with reference to FIGS. 4A-6E, are enhanced liquid-cooled heat sink assemblies, which are smaller, less expensive to fabricate, and are lighter-weight structures.

In general, disclosed herein are apparatuses which include a liquid-cooled heat sink assembly having a thermally conductive base structure and a manifold structure attached to the thermally conductive base structure. The thermally conductive base structure includes a sidewall surface and a main heat transfer surface, with the main heat transfer surface being sized or configured to couple to at least one component, such as at least one electronic component, to be cooled. The manifold structure attaches to the thermally conductive base structure, with the sidewall surface of the thermally conductive base structure residing at least partially within a recess in the manifold structure. Together, the manifold structure and thermally conductive base structure define a fluid-tight, coolant-carrying compartment through which liquid coolant flows, at least in part, in a direction substantially parallel to the main heat transfer surface of the thermally conductive base structure. In addition, at least one of the sidewall surface of the thermally conductive base structure or an opposing surface thereto of the manifold structure comprises a continuous groove. The heat sink also includes a sealing member disposed, at least in part, within the continuous groove. The sealing member ensures a fluid-tight seal between the thermally conductive base structure and the manifold structure, and in one or more embodiments, is a continuous sealing member, such as an O-ring.

In one or more embodiments, the sidewall surface of the thermally conductive base structure is oriented substantially perpendicular to the main heat transfer surface of the thermally conductive base structure. Further, the thermally conductive base structure may be fabricated of a different material from that of the manifold structure. For instance, the thermally conductive base structure may include or be fabricated of a metal material, such as copper or aluminum, and the manifold structure may be fabricated of a plastic material. In certain embodiments, the plastic manifold structure may comprise a thermoplastic, such as: Polyethylene (PE), Polypropylene (PP), Polyvinyl Chloride (PVC), Polytetrafluoroethylene (PTFE), Polyether Ether Keytone (PEEK), etc.

In one or more implementations, the thermally conductive base structure includes a base plate and a sidewall extending therefrom. The sidewall surface includes, at least in part, a surface of the sidewall of the thermally conductive base structure. For instance, the sidewall of the thermally conductive base structure may include an inner sidewall surface and an outer sidewall surface, with the sidewall surface having the continuous groove, or in opposition thereto, being or including one of the inner sidewall surface or the outer sidewall surface. Further, threads may be provided on the other one of the inner sidewall surface or the outer sidewall surface, where the manifold structure and the thermally conductive base structure are threadably attached, at least in part, via the threads. Additionally, or alternatively, threads could be provided on the inner sidewall surface or the outer sidewall surface having the continuous groove, or in opposition thereto, to facilitate the manifold structure and thermally conductive base structure being threadably attached together. Further, where threadably attached, permanent threaded attachment may be obtained using, if desired, a commercially available thread locker.

In certain implementations, the manifold structure and thermally conductive base structure are attached via multiple fasteners, with the sidewall of the thermally conductive base structure residing within the recess in the manifold structure. In these implementations, the fasteners are oriented in a direction substantially parallel to the main heat transfer surface of the thermally conductive base structure. One or more of the multiple fasteners extend through a portion of the manifold structure and engage a respective fastener notch in the sidewall of the thermally conductive base structure.

In one or more implementations, the manifold structure may include a coolant inlet, a coolant outlet, a coolant inlet manifold region and a coolant outlet manifold region, as well as at least one inlet orifice and at least one outlet orifice. In such configurations, the coolant inlet manifold region may be in fluid communication with the coolant inlet of the manifold structure, and the coolant outlet manifold region may be in fluid communication with the coolant outlet of the manifold structure. The at least one inlet orifice is in fluid communication with the coolant inlet manifold region and the coolant-carrying compartment, and the at least one outlet orifice is in fluid communication with the coolant outlet manifold region and the coolant-carrying compartment. In operation, liquid coolant may flow through the coolant inlet, the coolant inlet manifold region, the at least one inlet orifice, the coolant-carrying compartment, the at least one outlet orifice, and the coolant outlet manifold region, to the coolant outlet. Note that although described herein with reference to a coolant-carrying compartment, more than one coolant-carrying compartment could be defined between the base structure and manifold structure of the liquid-cooled heat sink assemblies, if desired.

In one or more implementations, the at least one inlet orifice may include at least one inlet slot positioned over a central region of the coolant-carrying compartment to facilitate introducing the liquid coolant flow into the coolant-carrying compartment in the central region thereof. By way of further example, a plurality of thermally conductive fins may be disposed within the coolant-carrying compartment to facilitate transfer of heat from the electronic component(s) to be cooled to the liquid coolant flowing through the coolant-carrying compartment of the liquid-cooled heat sink assembly. For instance, the plurality of thermally conductive fins could comprise a plurality of parallel-disposed, thermally conductive plate fins, which define channels between the fins, into which coolant is introduced and flows, for example, from a central region of the coolant-carrying compartment out towards a peripheral region of the coolant-carrying compartment. In this configuration, the manifold structure may include multiple peripheral outlet orifices in fluid communication with the coolant-carrying compartment. Alternatively, the at least one inlet orifice and at least one outlet orifice could be positioned at opposite sides of the plurality of thermally conductive fins, with liquid coolant flowing through the plurality of thermally conductive fins from a first side to a second side of the liquid-cooled heat sink.

By way of specific example, FIGS. 4A-4E depict one embodiment of an apparatus 400, in accordance with one or more aspects of the present invention. As illustrated, in this embodiment, apparatus 400 includes one or more electronic components 401 (FIG. 4A), and a liquid-cooled heat sink assembly 410 (shown in exploded view in FIG. 4A). The one or more electronic components 401 may be disposed, for instance, on a supporting substrate 402, which may facilitate electrical connection of the electronic component(s) to other components of an electronic system.

Referring collectively to FIGS. 4A-4E, liquid-cooled heat sink assembly 410 includes, for instance, a thermally conductive base structure 420 and a manifold structure 430, which in the depicted embodiment, is defined by a lower manifold member 431 and an upper manifold member 435. The liquid-cooled heat sink assembly further includes a sealing member 440, and if desired, a flow-blocking insert 450.

Figure 4B:
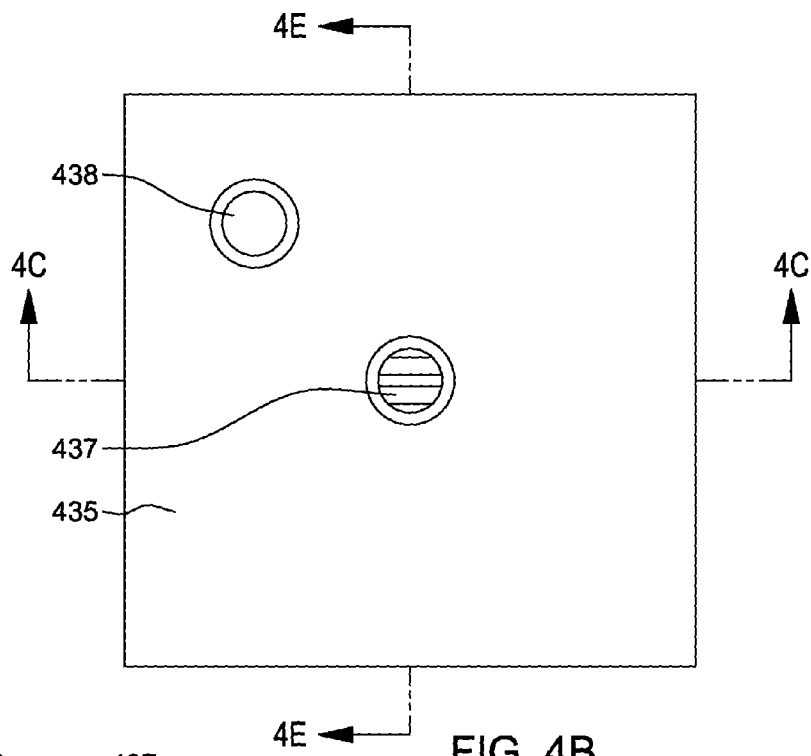
FIG. 4B is a plan view of the liquid-cooled heat sink assembly of FIG. 4A, in accordance with one or more aspects of the present invention.
Figure 4C:
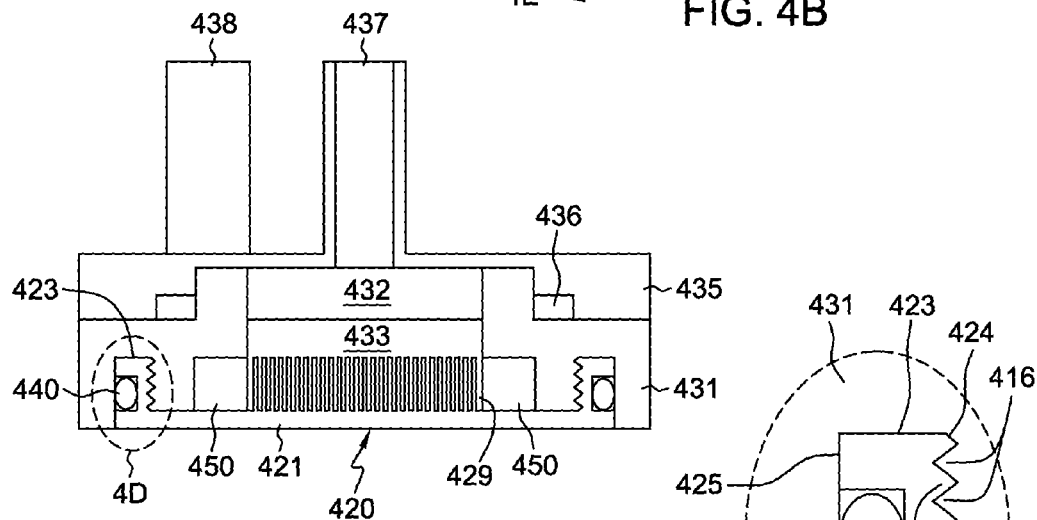
FIG. 4C is a cross-sectional elevational view of the liquid-cooled heat sink assembly of FIG. 4B, taken along line 4C-4C thereof, in accordance with one or more aspects of the present invention.
Figure 4D:
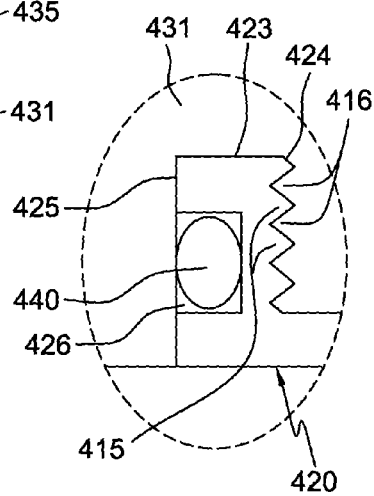
FIG. 4D is a partial enlargement of the liquid-cooled heat sink assembly of FIG. 4C, taken along line 4D thereof, in accordance with one or more aspects of the present invention.
Figure 4E:
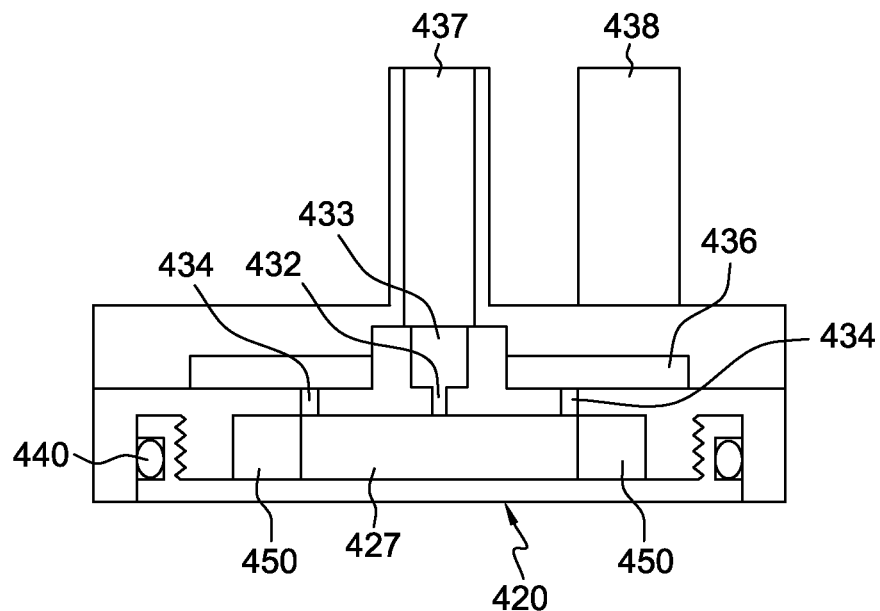
FIG. 4E is a cross-sectional elevational view of the liquid-cooled heat sink assembly of FIG. 4B, taken alone line 4E-4E thereof, in accordance with one or more aspects of the present invention.
Figure 4F:
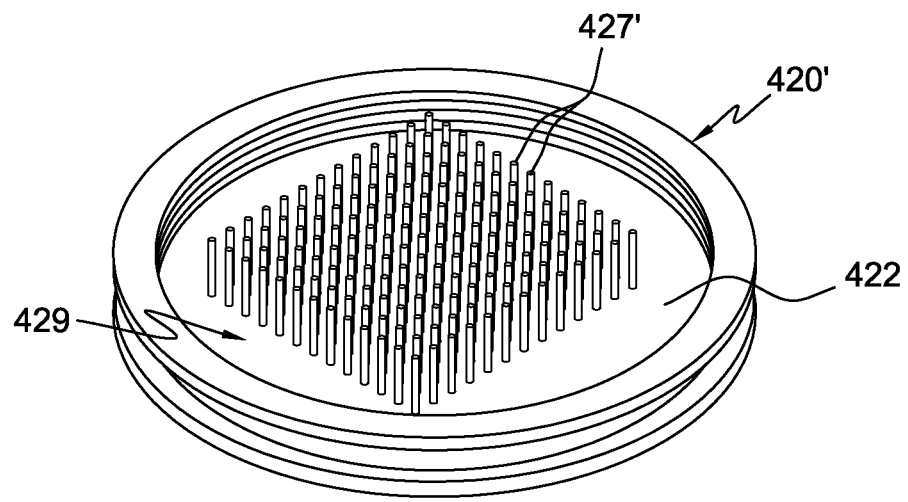
FIG. 4F illustrates an alternate embodiment of a thermally conductive base structure which may be employed in a liquid-cooled heat sink assembly and apparatus, such as depicted in FIGS. 4A-4E, in accordance with one or more aspects of the present invention.

In the heat sink assembly embodiment of FIGS. 4A-4E, thermally conductive base structure 420 is circular-shaped, by way of example only, and has a smaller footprint than manifold structure 430, within which the base structure resides, as illustrated. Manifold structure 430, and in particular, lower manifold member 431, may be configured to receive thermally conductive base structure 420 within an appropriately shaped recess, as depicted in FIGS. 4C-4E. In one embodiment, liquid-cooled heat sink assembly 410 may be a composite heat sink, with the thermally conductive base structure being fabricated, for instance, of a good thermal conductor, such as metal, for instance, copper or aluminum, and the manifold structure being fabricated of a different, less expensive, and less thermally conductive material, such as, for instance, a thermoplastic. By way of example, the thermoplastic could comprise Polyethylene (PE), Polypropylene (PP), Polyvinyl Chloride (PVC), Polytetrafluoroethylene (PTFE), Polyether Ether Keytone (PEEK), etc. In a multi-manifold member implementation such as depicted in FIGS. 4A-4E, the upper and lower manifold members 431, 435 may each be fabricated of plastic, for example, formed by injection-molding, with the upper member subsequently being bonded to the lower member using any known plastic-joining technique, or mechanically coupled using appropriate fasteners and seals.

In the depicted embodiment, thermally conductive base structure 420 is circular-shaped and includes a sidewall surface 425 with a gland or a continuous groove 426 formed therein, sized to accommodate, at least in part, sealing member 440. Thermally conductive base structure 420 further includes a main heat transfer surface 421 sized and configured to couple to electronic component(s) 401 to be cooled. By way of example, the main heat transfer surface 421 may be a flat, lower surface of a base plate 422 of thermally conductive base structure 420, which is appropriately sized to couple and substantially cover the electronic component(s) to be cooled. Further, a sidewall 423 may extend, for instance, substantially perpendicular from base plate 422. This sidewall 423 includes an inner sidewall surface 424 and sidewall surface 425, which in this example, is an outer sidewall surface of sidewall 423. Note that, alternatively, the sidewall surface having the continuous groove (or in opposition to the continuous groove) may be or include inner sidewall surface 424 or even the edge surface of base plate 422 of the thermally conductive base structure 420. Still further, note that multiple continuous grooves could be provided in association with the thermally conductive base structure, and/or in association with the opposing surface of the manifold structure to provide enhanced sealing between the components.

Together, the thermally conductive base structure 420 and manifold structure 430 define a coolant-carrying compartment 429, or multiple coolant-carrying compartments, through which liquid coolant flows, at least in part, in a direction substantially parallel to main heat transfer surface 421 of thermally conductive base structure 420. The coolant-carrying compartment within the heat sink assembly could be configured as a chamber, channel, passageway, etc., depending on the requirements of a particular heat removal implementation. Coolant-carrying compartment 429 is a fluid-tight compartment through which liquid coolant flows between a coolant inlet 437 and a coolant outlet 438 of the liquid-cooled heat sink assembly 410, and more particularly, of the manifold structure 430. Note that coolant inlet 437 and coolant outlet 438 are illustrated tubular-shaped, as one example only. The coolant inlet and outlet may be fabricated to include, for instance, hose barbs, threaded connections (SAE, NPT, etc.), tube sockets, etc., for joining the coolant inlet and coolant outlet to respective conduits of an associated cooling system, such as the exemplary systems described above in connection with FIGS. 1-3.

In the depicted embodiment, thermally conductive base structure 420 includes a plurality of thermally conductive fins 427 extending from base plate 422, into coolant-carrying compartment 429. Further, in the example of FIGS. 4A-4E, a centrally-located inlet orifice 433 in lower manifold member 431 and two peripheral, outlet orifices 434 in lower manifold member 431, are provided. In this example, the inlet orifice 433 is configured as an inlet slot orifice, and the outlet orifices 434 are configured as outlet slot orifices. Note that the position, shape, and number of inlet and outlet orifices to the coolant-carrying compartment may vary as desired for a particular application. Depending on the configuration of the coolant-carrying compartment 429, flow-blocking insert 450 may be provided to facilitate a more uniform flow of liquid coolant through the coolant-carrying compartment. For instance, in the embodiment of FIGS. 4A-4E, the coolant-carrying compartment is substantially circular-shaped, and the plurality of thermally conductive fins are provided in a rectangular array, for example, shaped and sized to overlie the electronic component to be cooled. Thus, flow-blocking insert 450 may be provided to limit the liquid coolant flow to the thermally conductive fin region within the coolant-carrying compartment. This may advantageously facilitate a more uniform coolant flow from inlet orifice 433 to outlet orifices 434, through (in the depicted embodiment) multiple parallel channels defined between the thermally conductive fins 427 extending from base plate 422.

In the illustrated embodiment, lower manifold member 431 includes a coolant inlet manifold region 432, and together, lower manifold member 431 and upper manifold 435 define a coolant outlet manifold region 436. The one or more inlet orifices 433 and the one or more outlet orifices 434 are respectively in fluid communication with coolant inlet manifold region 432 and coolant outlet manifold region 436, as well as with the coolant-carrying compartment 429, defined between thermally conductive base structure 420 and manifold structure 430. Further, coolant inlet 437 is in fluid communication with coolant inlet manifold region 432, and coolant outlet 438 is in fluid communication with coolant outlet manifold region 436. In operation, liquid coolant flows (in one example) through coolant inlet 437, coolant inlet manifold region 432, inlet orifice(s) 433, coolant-carrying compartment 429, outlet orifice(s) 434, and coolant outlet manifold region 436, to coolant outlet 438. Note with respect to coolant flow that, with the inlet orifice(s) 433 disposed over the plurality of thermally conductive fins 427, in the central region of the coolant-carrying compartment 429, liquid coolant enters the coolant-carrying compartment and bifurcates upon contact with base plate 422 for outward flow in opposite directions within the channels formed between the thermally conductive fins.

Note further that other configurations of thermally conductive fins may be employed. For instance, reference FIG. 4F, where a thermally conductive base structure 420' is depicted substantially identical to base structure 420 of FIGS. 4A-4E, but with an array of thermally conductive pin fins 427' extending within coolant-carrying compartment 429 from base plate 422, rather than a plurality of parallel-disposed, thermally conductive plate fins, as in the example of FIGS. 4A-4E. Other thermally conductive fin configurations and arrays may be employed, as desired. Further, liquid-cooled heat sink assemblies may be formed in accordance with the concepts disclosed herein, without the use of thermally conductive fins within the coolant-carrying compartment(s).

As illustrated in FIGS. 4A-4E, the heat sink assembly is characterized, at least in part, by thermally conductive base structure 420 mechanically coupling to manifold structure 430, with manifold structure 430 having a larger footprint, and being configured to receive thermally conductive base structure 420, at least in part, within a recess therein. In the embodiment illustrated, the recess in the manifold structure, and in particular, in the lower manifold member 431, is sized and configured to receive sidewall 423 of thermally conductive base structure 420. As noted, in the embodiment of FIGS. 4A-4E, continuous groove 426 is disposed (by way of example) within a sidewall surface 425 of the thermally conductive base structure, and in particular, within the outer sidewall surface. The recess in the manifold structure is defined, in part, by an opposing surface of the manifold structure to the sidewall surface having continuous groove 426 formed therein. In an alternate implementation, the continuous groove could be positioned within the opposing surface of the manifold structure, or both the opposing surface and the outer sidewall surface could include a continuous groove sized to accommodate the same (in part) or different, respective sealing members, such as the same or different O-rings.

In the depicted configuration, sidewall 423 is circular-shaped, and has threads 415 on inner sidewall surface 424, which threadably engage corresponding threads 416 on the opposing surface of the manifold structure 430. In this manner, the thermally conductive base structure may be threadably attached to the manifold structure, with sealing member 440 providing a fluid-tight seal within the recess in the manifold structure, between the thermally conductive base structure and the manifold structure. If desired, thermally conductive base structure 420 could be threadably locked to manifold structure 430 using a commercially available thread locker, such as Locktite®, manufactured by Henkel Corporation of Ambler, Pa., (USA).

Advantageously, the combination of a sealing member engaging one sidewall surface, and a threaded connection (with tapered threads or a thread sealer) being provided on the other sidewall surface of the base sidewall structure, provides redundant sealing which ensures that leakage does not occur between the thermally conductive base structure and the manifold structure, notwithstanding that the base structure and manifold structure are separately manufactured, and even separately manufactured of different materials. Further, the configuration provided results in a force being applied to the sealing member that is substantially parallel to the main heat transfer surface of the thermally conductive base structure. This facilitates a more compact heat sink assembly compared, for instance, with an implementation where the sealing member is disposed on a surface parallel to the main heat transfer surface, and the force is applied perpendicular to the main heat transfer surface.

Numerous liquid-cooled heat sink assembly configurations embodying the concepts disclosed herein are possible. For instance, FIGS. 5A-5D depict an alternate implementation, where the liquid-cooled heat sink assembly 410' includes a single-piece manifold structure 500. As illustrated, in this embodiment, an apparatus is provided which is similar to apparatus 400 described above in connection with FIGS. 4A-4E. The apparatus includes a liquid-cooled heat sink assembly 410' (shown in exploded view in FIG. 5A) for cooling one or more electronic components 401, which may be disposed, for instance, on a supporting substrate 402.

Referring collectively to FIGS. 5A-5D, liquid-cooled heat sink assembly 410' includes the above-described thermally conductive base structure 420, as well as the depicted manifold structure 500, which may be a single-piece manifold structure, such as a single-piece, molded, plastic manifold structure. The liquid-cooled heat sink assembly further includes sealing member 440, and if desired, one or more flow-blocking inserts 550.

Figure 5A:
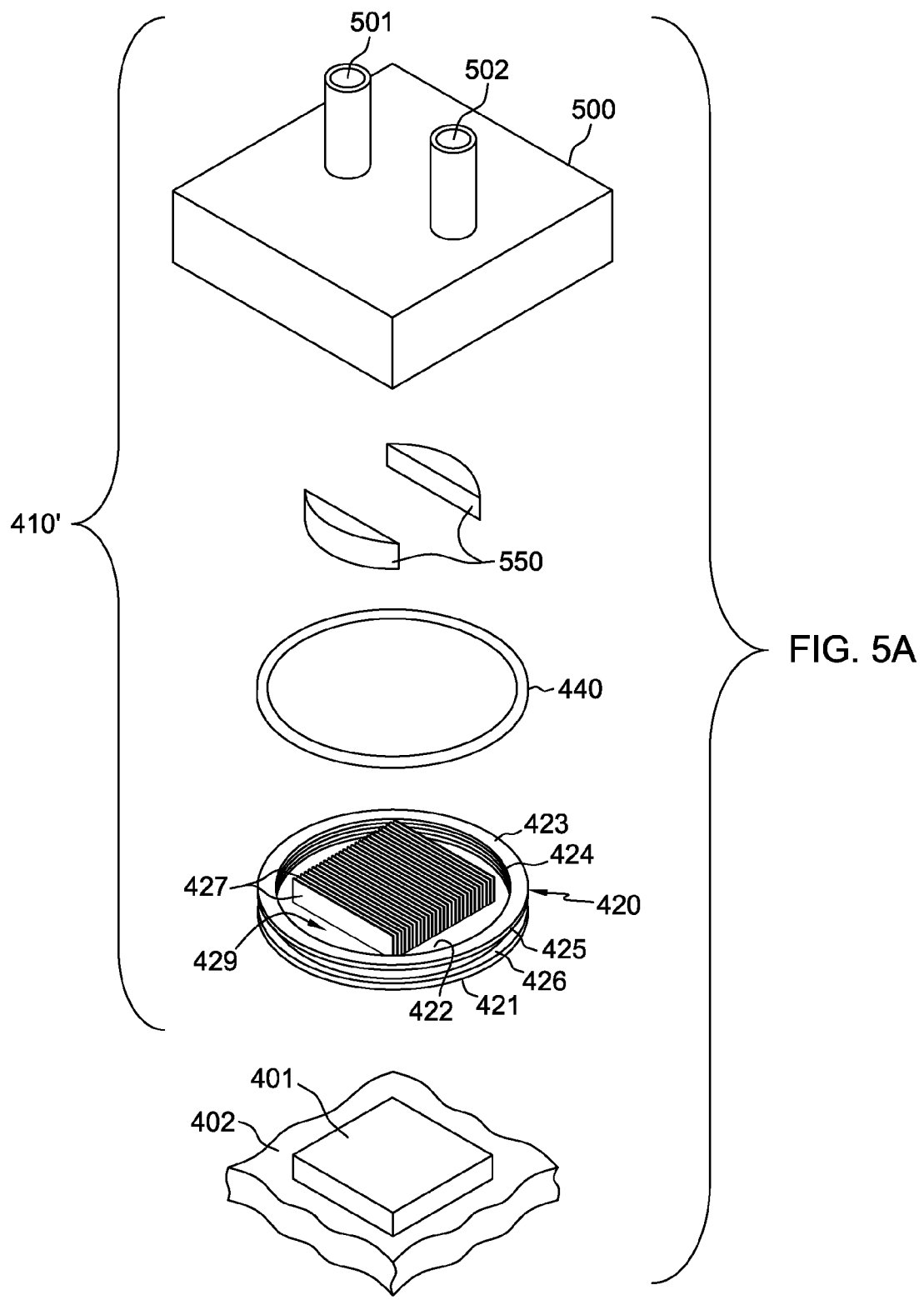
FIG. 5A depicts an exploded view of another embodiment of an apparatus comprising at least one electronic component to be cooled, and a liquid-cooled heat sink assembly, in accordance with one or more aspects of the present invention.
Figure 5B:
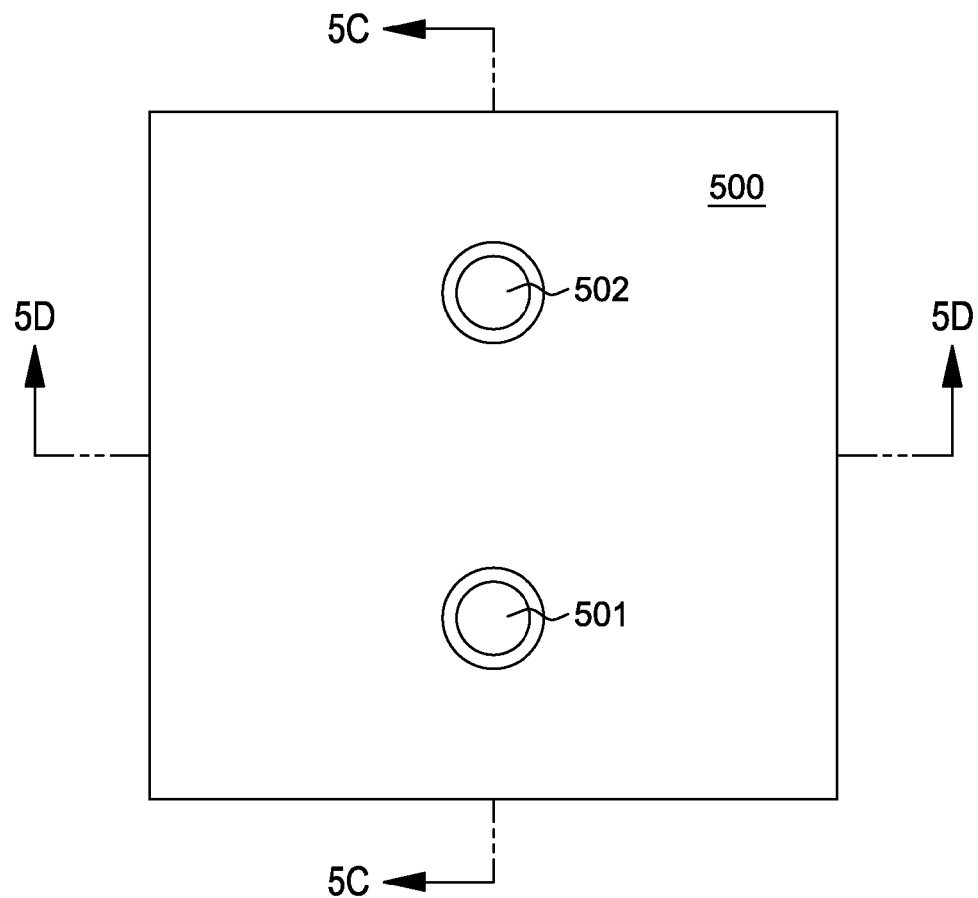
FIG. 5B is a plan view of the liquid-cooled heat sink assembly of FIG. 5A, in accordance with one or more aspects of the present invention.
Figure 5C:
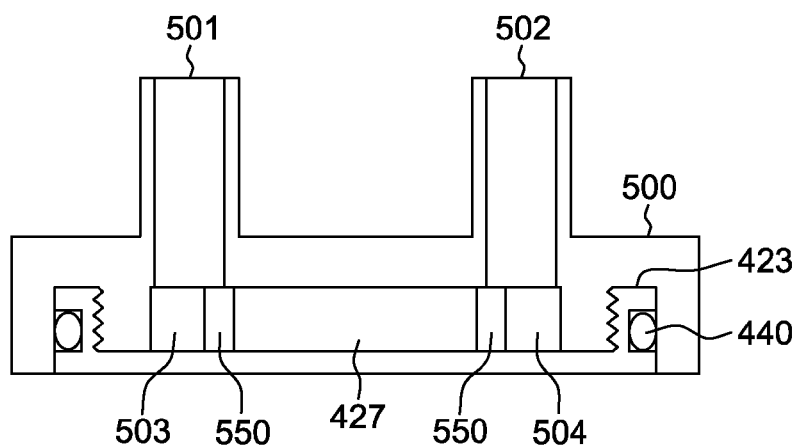
FIG. 5C is a cross-sectional elevational view of the liquid-cooled heat sink assembly of FIG. 5B, taken along line 5C-5C thereof, in accordance with one or more aspects of the present invention.
Figure 5D:
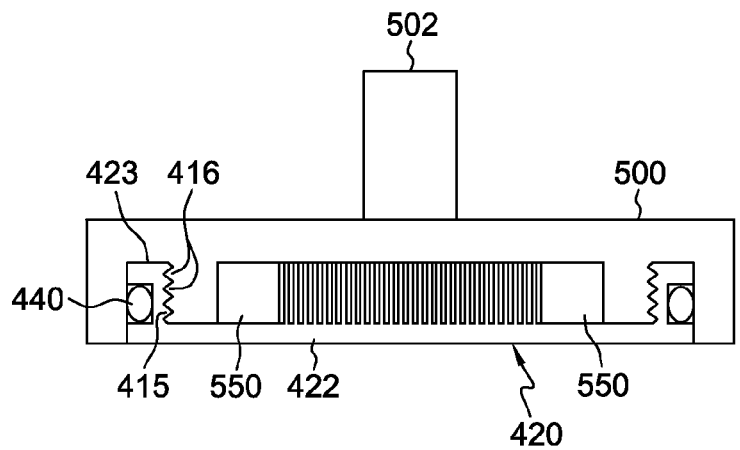
FIG. 5D is a cross-sectional elevational view of the liquid-cooled heat sink assembly of FIG. 5B, taken along line 5D-5D thereof, in accordance with one or more aspects of the present invention.

As with the heat sink assembly embodiment of FIGS. 4A-4E, thermally conductive base structure 420 is circular-shaped, by way of example only, and has a smaller footprint than manifold structure 500, within which the base structure resides. Manifold structure 500 is configured to receive thermally conductive base structure 420 within an appropriately-shaped recess, as depicted in FIGS. 5C & 5D. Advantageously, in one or more embodiments, liquid-cooled heat sink assembly 410' is a composite heat sink, with the thermally conductive base structure being fabricated, for instance, of a metal, such as copper or aluminum, and the manifold structure being fabricated of a good thermal conductor, such as a metal, for instance, copper or aluminum, and the manifold structure being fabricated of a different, less expensive, less thermally conductive material, such as a thermoplastic, as noted above in connection with the embodiment of FIGS. 4A-4E.

Together, thermally conductive base structure 420 and manifold structure 500 define coolant-carrying compartment 429, or multiple coolant-carrying compartments, through which liquid coolant is to flow, at least in part, in a direction substantially parallel to the main heat transfer surface 421 of thermally conductive base structure 420. As noted, the coolant-carrying compartment within the heat sink assembly could be configured as a chamber, channel, passageway, etc., depending on the requirements of a particular heat removal implementation. Note that manifold structure 500 includes a coolant inlet 501 and a coolant outlet 502, which are in fluid communication with the coolant-carrying compartment of the liquid-cooled heat sink assembly 410'. Coolant inlet 501 and coolant outlet 502 are illustrated (by way of example) as tubular-shaped. The coolant inlet and outlet may be fabricated to include, for instance, hose barbs, threaded connections (SAE, NPT, etc.), tube sockets, etc., for joining the coolant inlet and coolant outlet to respective conduits of an associated cooling system.

In the depicted embodiment, thermally conductive base structure 420 includes a plurality of thermally conductive fins 427 extending from base plate 422 into coolant-carrying compartment 429, as illustrated. Further, in the example of FIGS. 5A-5D, the coolant inlet 501 and coolant outlet 502 are disposed on opposite sides of the thermally conductive fins 427, with a coolant inlet manifold region 503 and a coolant outlet manifold region 504 being defined within the coolant-carrying compartment 429. The coolant inlet 501 is in fluid communication with the coolant inlet manifold region 503, for instance, via one or more inlet orifices in the manifold structure, and the coolant outlet 502 is in fluid communication with the coolant outlet manifold region 504, for example, via one or more outlet orifices in the manifold structure. Note that the position, shape, and number of inlet and outlet orifices to the coolant-carrying compartment may vary as desired for a particular application. In this configuration, two flow-blocking inserts 550 are provided to facilitate more uniform flow of liquid coolant through the coolant-carrying compartment 429. Note that the configuration of flow-blocking inserts 550 is different from that of flow-blocking insert 450 in the embodiment of FIGS. 4A-4E, in order to facilitate defining the coolant inlet and outlet manifold regions within the coolant-carrying compartment 429 of the liquid-cooled heat sink assembly 410'. In operation, liquid coolant flows through coolant inlet 501, to coolant inlet manifold region 503, through the channels between the thermally conductive fins 427 of the coolant-carrying compartment 429, to the coolant outlet manifold region 504, and then to coolant outlet 502 of the manifold structure.

As illustrated in FIGS. 5A-5D, the heat sink assembly 410' is characterized, at least in part, by thermally conductive base structure 420 mechanically coupling to manifold structure 500, with manifold structure 500 having a larger footprint, and being configured to receive thermally conductive base structure 420, at least in part, within a recess therein. In the embodiment illustrated, the recess in the manifold structure is sized and configured to receive sidewall 423 of thermally conductive base structure 420. In one embodiment, continuous groove 426 is disposed (by way of example) within a sidewall surface of the thermally conductive base structure, and in particular, within the outer sidewall surface 425 thereof, that is, in the example depicted. The recess in the manifold structure 500 is defined, at least in part, by an opposing surface of the manifold structure to the sidewall surface having continuous groove 426 formed therein.

Note that in an alternate implementation, the continuous groove could be positioned within the opposing surface of the manifold structure, or both the opposing surface of the manifold structure and the outer sidewall surface of the base structure could include continuous grooves, sized to accommodate the same (in part) or different, respective sealing members, such as the same or different O-rings. In the depicted configuration, the sidewall 423 is circular-shaped, and has threads 415 on inner sidewall surface 427, which threadably engage corresponding threads 416 on the opposing surface of manifold structure 500. In this manner, the thermally conductive base structure may be threadably attached to the manifold structure, with sealing member 440 providing a fluid-tight seal within the recess in the manifold structure, between the thermally conductive base structure and the manifold structure. If desired, thermally conductive base structure 420 could be threadably locked to manifold structure 500 using a commercially available thread locker, such as the above-referenced Locktite®.

As with the embodiment described above, the combination of a sealing member engaging one sidewall surface and a threaded connection (with tapered threads or a thread sealer) being provided, for instance, on the other sidewall surface of the base structure, provides redundant sealing which ensures that leakage does not occur between the thermally conductive base structure and the manifold structure, notwithstanding that the base structure and manifold structure are separately manufactured, and even separately manufactured of different materials. Further, the configuration provided results in a force being applied to the sealing member that is substantially parallel to the main heat transfer surface of the thermally conductive base structure. This facilitates a more compact heat sink assembly compared, for instance, with an implementation where the sealing member is disposed on a surface parallel to the main heat transfer surface.

Figure 5E:
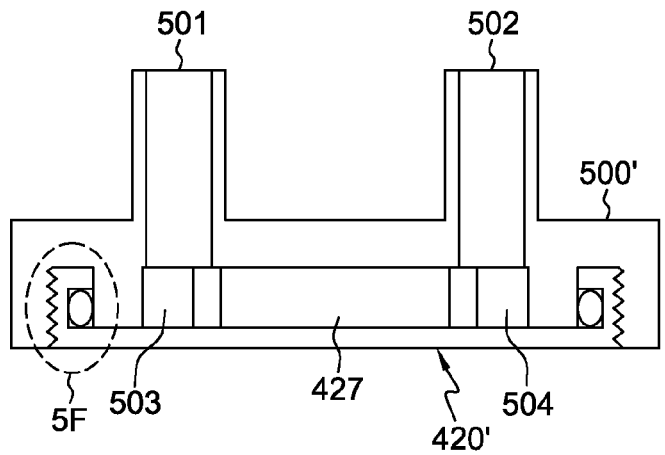
FIG. 5E is a cross-sectional elevational view of an alternate embodiment of the liquid-cooled heat sink assembly of FIGS. 5A-5D, in accordance with one or more aspects of the present invention.
Figure 5F:
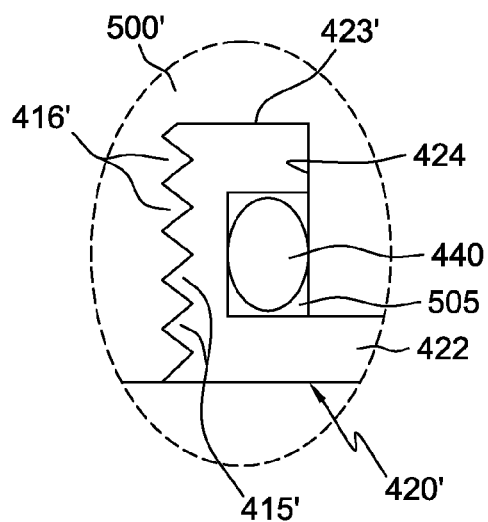
FIG. 5F is a partial enlargement of the liquid-cooled heat sink assembly embodiment of FIG. 5E, taken along line 5F thereof, in accordance with one or more aspects of the present invention.

FIGS. 5E & 5F depict a variation on the heat sink assembly 410' of FIGS. 5A-5D. In this embodiment, a continuous groove 505 is formed within inner sidewall surface 424 of sidewall 423' of the thermally conductive base plate 420'. Further, manifold structure 500' includes threads 416', sized and configured to engage threads 415' on outer sidewall surface of sidewall 423', with the thermally conductive base structure threadably attached to the manifold structure. Note that in this example, the threads 416' and 415' extend for the full height of the base structure, which is fully inserted into the manifold structure. That is, the threads 415' extend downwards along the edge surface of base plate 422 of the thermally conductive base structure 420', as well as along the outer sidewall surface, as one further example.

FIGS. 6A-6E depict a further variation on an apparatus 600, in accordance with one or more aspects of the present invention. In this embodiment, apparatus 600 includes one or more electronic components 401, and a liquid-cooled heat sink assembly 610 (shown in exploded view in FIG. 6A).

Referring collectively to FIGS. 6A-6E, liquid-cooled heat sink assembly 610 includes, for instance, a thermally conductive base structure 620 and a manifold structure 500", such as the above-described manifold structure 500, however, modified as described below. The liquid-cooled heat sink further includes, in the depicted embodiment, multiple sealing members 440.

Figure 6B:
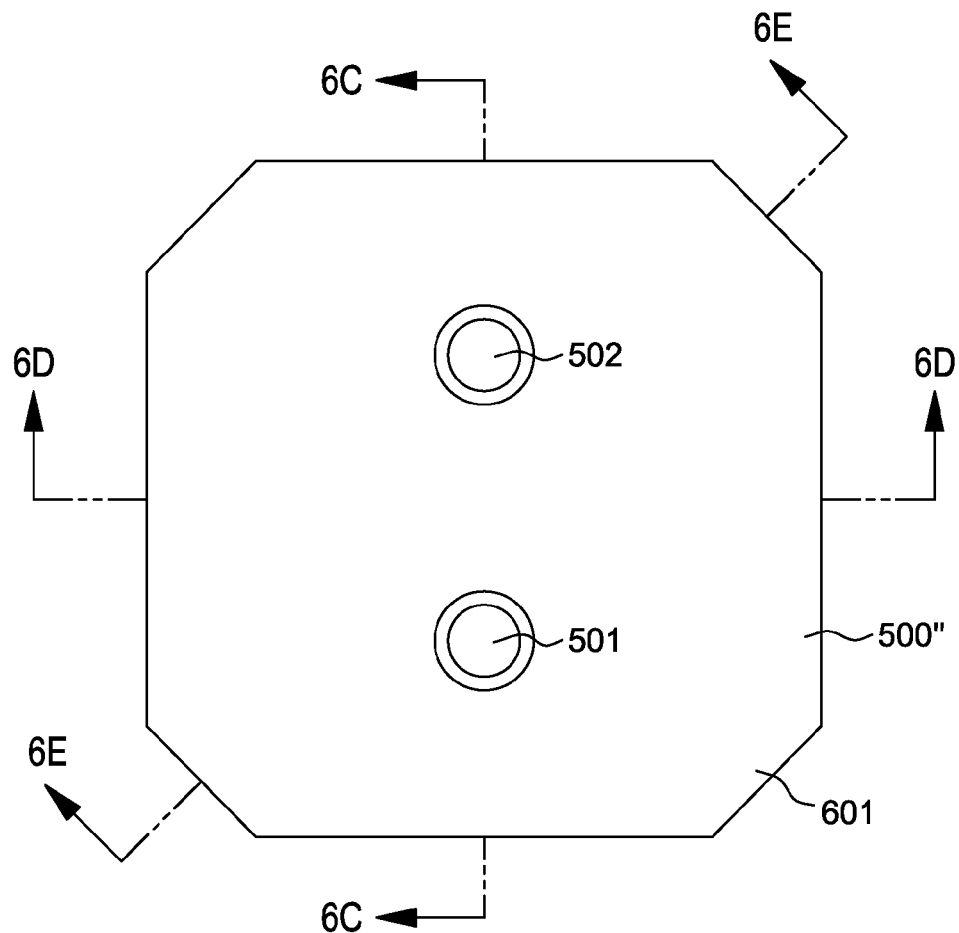
FIG. 6B is a plan view of the liquid-cooled heat sink assembly of FIG. 6A, in accordance with one or more aspects of the present invention.
Figure 6C:
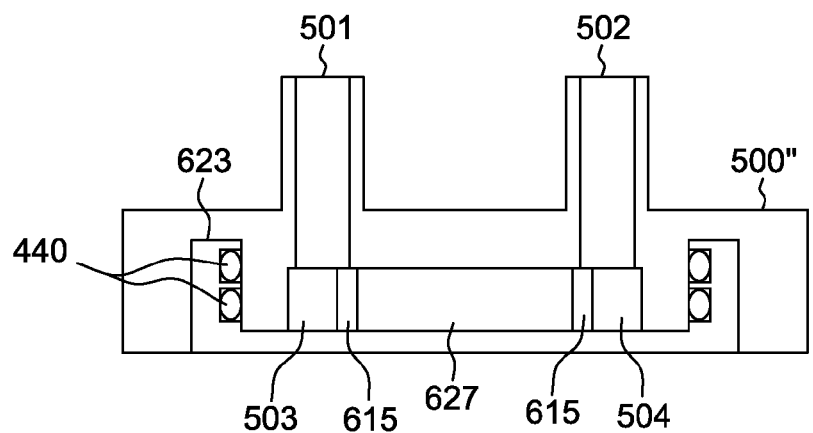
FIG. 6C is a cross-sectional elevational view of the liquid-cooled heat sink assembly of FIG. 6B, taken along line 6C-6C thereof, in accordance with one or more aspects of the present invention.
Figure 6D:
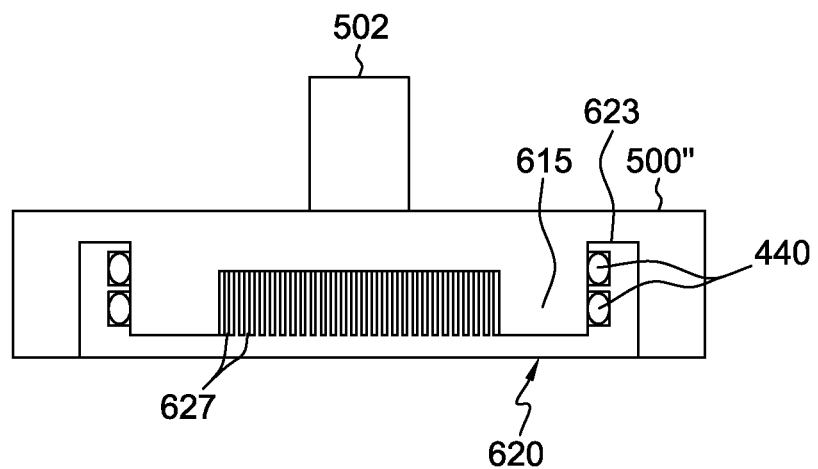
FIG. 6D is a cross-sectional elevational view of the liquid-cooled heat sink assembly of FIG. 6B, taken along line 6D-6D thereof, in accordance with one or more aspects of the present invention.
Figure 6E:
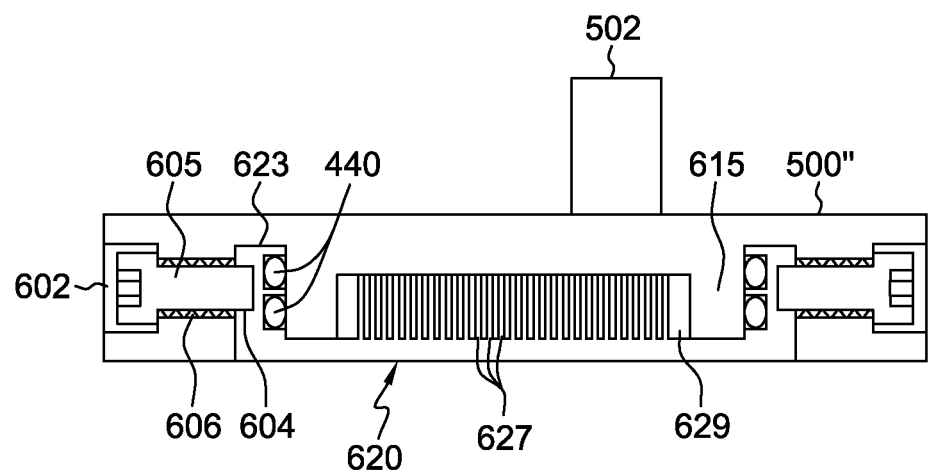
FIG. 6E is a cross-sectional elevational view of the liquid-cooled heat sink assembly of FIG. 6D, taken along line 6E-6E thereof, in accordance with one or more aspects of the present invention.

In the heat sink assembly embodiment of FIGS. 6A-6E, thermally conductive base structure 620 is circular-shaped, by way of example only, and has a smaller footprint than manifold structure 500", within which the base structure resides. Manifold structure 500" is configured to receive thermally conductive base structure 620 within an appropriately shaped recess, as depicted in FIGS. 6C-6E. In one embodiment, liquid-cooled heat sink assembly 610 is a composite heat sink, with the thermally conductive base structure being fabricated, for instance, of a metal, such as copper or aluminum, and the manifold structure being fabricated of a different, less expensive material, such as, for instance, a thermoplastic, such as noted above.

In the depicted embodiment, thermally conductive base structure 620 includes a sidewall 623 which is circular-shaped and has a sidewall surface 624 with one or more glands or continuous grooves 626 formed therein, sized to accommodate, at least in part, sealing member(s) 440. In one embodiment, two continuous grooves 626 are provided within sidewall surface 624. Thermally conductive base structure 620 further includes a main heat transfer surface 621 sized and configured to couple to electronic component(s) 401 to be cooled. By way of example, the main heat transfer surface 621 may be a flat, lower surface of a base plate 622 of thermally conductive base structure 620, which is appropriately sized to couple and substantially cover or align over the electronic component(s) to be cooled. Further, sidewall 623 may extend, for instance, substantially perpendicular from, base plate 622. This sidewall 623 includes sidewall surface 624, which in the depicted example, is an inner sidewall surface of sidewall 623, and includes an outer sidewall surface 625. Note that, alternatively, the sidewall surface having the continuous groove(s), or in opposition to the continuous groove(s), may be or include outer sidewall surface 625, or even the edge surface of base plate 622 of thermally conductive base structure 620. Still further, note that although multiple continuous grooves are illustrated in this example, a single continuous groove could be provided in association with thermally conductive base structure and/or in association with the opposing surface of the manifold structure.

Together, the thermally conductive base structure 620 and manifold structure 500" define a coolant-carrying compartment 629, or multiple coolant-carrying compartments, through which liquid coolant flows, for instance, in a direction substantially parallel to main heat transfer surface 621 of thermally conductive base structure 620. The coolant-carrying compartment within the liquid-cooled heat sink assembly could be configured as a chamber, channel, passageway, etc., depending on the requirements of a particular heat removal implementation. Coolant-carrying compartment 629 is a fluid-tight compartment, through which liquid coolant flows between coolant inlet 501 and coolant outlet 502 of the liquid-cooled heat sink assembly 610, and more particular, of manifold structure 500". Note that coolant inlet 501 and coolant outlet 502 are illustrated tubular-shaped, by way of example only. The coolant inlet and outlet may be fabricated to include, for instance, hose barbs, threaded connections (SAE, NPT, etc.), tube sockets, etc., for joining the coolant inlet and coolant outlet to respective conduits of an associated cooling system, such as the systems described above in connection with FIGS. 1-3.

In the depicted embodiment, thermally conductive base structure 620 includes a plurality of thermally conductive fins 627 extending from base plate 622, into coolant-carrying compartment 629, in a manner similar to the embodiments described above in connection with FIGS. 4A-5F. Further, in this example, manifold structure 500" is configured with coolant inlet 501 in fluid communication with coolant inlet manifold region 503, for instance, via one or more inlet orifices in the manifold structure, and the coolant outlet 502 in fluid communication with coolant outlet manifold region 504, for example, via one or more outlet orifices in the manifold structure.

In this embodiment, manifold structure 500" is further configured with flow-blocking regions 615, which may contact base plate 622 of thermally conductive base structure 620, and facilitate directing liquid coolant flow through the thermally conductive fins 627 extending from base plate 622, eliminating the need for one or more separate flow-blocking inserts. As in the example of FIGS. 5A-5F, coolant flow in this embodiment is from one side to an opposite side of the thermally conductive fins, that is, from the coolant inlet manifold region 503 to the coolant outlet manifold region 504 provided within the coolant-carrying compartment. In operation, liquid coolant flows through coolant inlet 501, the inlet orifice(s), coolant inlet manifold region 503, coolant-carrying compartment 629, coolant outlet manifold region 504, the outlet orifice(s), to the coolant outlet 502.

In this embodiment, manifold structure 500" is modified to include clipped corners 601 with openings 602 sized to receive respective fasteners 605. Further, thermally conductive base structure 620 may include fastener notches 604, which are engaged by ends of fastener 605 when inserted into the respective openings 602. Threaded inserts 606 may be embedded within the openings 602 in manifold structure 500" to facilitate threading of fasteners 605 into the manifold structure 500" to thermally conductive base structure 620. In this side fastener locking approach, a slight loosening of the threaded fasteners 605 will not result in liquid coolant leakage past the sealing members 440. Note also that no threads are required within the thermally conductive base structure, and thus, the base structure and corresponding recess in the manifold structure may have various non-circular shapes, if desired. Further, note in this regard, that the sealing members, for instance, O-rings, are continuous, flexible members, and are able to take on the configuration of the continuous grooves within which the members at least partially reside.

In the embodiment illustrated in FIGS. 6A-6E, the heat sink assembly is characterized, at least in part, by thermally conductive base structure 620 mechanically coupling to manifold structure 500", with manifold structure 500" having a larger footprint, and being configured to receive thermally conductive base structure 620, at least in part, within a recess therein. In the embodiment illustrated, the recess in the manifold structure is sized and configured to receive sidewall 623 of thermally conductive base structure 620. As noted, continuous grooves 626 are disposed (by way of example) within a sidewall surface of the thermally conductive base structure, and in particular, within the inner sidewall surface 624. The recess in the manifold structure is defined, in part, by an opposing surface to the sidewall surface having continuous grooves 626 formed therein. In an alternate implementation, the continuous grooves could be positioned within the opposing surface, or both the opposing surface and the inner sidewall surface 624 could include continuous grooves, sized to accommodate the same (in part) or different sealing members, such as respective O-rings.

Those skilled in the art will note that provided herein, in one aspect, is an apparatus which includes a liquid-cooled heat sink assembly. The liquid-cooled heat sink assembly includes: a thermally conductive base structure, having a sidewall surface and a main heat transfer surface, the main heat transfer surface to couple to at least one component to be cooled; a manifold structure attached to the thermally conductive base structure, with the sidewall surface of the thermally conductive base structure residing at least partially within a recess in the manifold structure, the manifold structure and the thermally conductive base structure together defining a coolant-carrying compartment through which liquid coolant flows, at least in part, in a direction substantially parallel to the main heat transfer surface of the thermally conductive base structure, and wherein at least one of the sidewall surface of the thermally conductive base structure or an opposing surface thereto of the manifold structure comprises a continuous groove; and a sealing member disposed, at least in part, within the continuous groove, the sealing member providing a fluid-tight seal between the thermally conductive base structure and the manifold structure.

Advantageously, the above-summarized liquid-cooled heat sink assembly comprises an enhanced heat sink configuration, with good attachment and sealing between the thermally conductive base structure and the manifold structure. For instance, by attaching the thermally conductive base structure to the manifold structure within the recess in the manifold structure, a smaller overall footprint for the heat sink assembly is achievable, that is, compared with a conventional approach requiring separate fasteners and openings offset from the main heat transferring area of the heat sink. Further, a smaller footprint in the Z direction is achieved by recessing the thermally conductive base structure at least partially within the manifold structure. Still further, enhanced sealing is achieved by the sealing member being disposed on or engaging the sidewall surface of the thermally conductive base structure, within the recess in the manifold structure. By appropriately sizing the components, compressive loading on the sealing member is readily obtained to form the desired fluid-tight seal between the thermally conductive base structure and manifold structure.

In certain embodiments, the sidewall surface of the thermally conductive base structure is oriented substantially perpendicular to the main heat transfer surface of the thermally conductive base structure, and the thermally conductive base structure is fabricated of a different material from that of the manifold structure. For instance, the thermally conductive base structure may include or be fabricated of a metal material with good thermal conduction properties, such as copper, and the manifold structure may be fabricated of a less expensive material, such as a plastic, or more particularly, a thermoplastic material. For example, the manifold structure may be formed as one or multiple molded plastic manifold members. Advantageously, in these embodiments, the heat sink assembly is less expensive to manufacture and lighter weight due to the use of the different components with, for instance, the heavier and more costly thermally conductive material only being employed in the thermally conductive base structure where needed for efficient heat transfer performance of the assembly.

As a further enhancement, the thermally conductive base structure may have a base plate and a sidewall extending therefrom. The sidewall surface may be or include, at least in part, a surface of the sidewall of the thermally conductive base structure. For instance, the sidewall of the thermally conductive base structure may include an inner sidewall surface and an outer sidewall surface, with the sidewall surface having the continuous groove (or in opposition to the continuous groove) being one of the inner sidewall surface or the outer sidewall surface. Further, threads may be provided, for instance, on the other one of the inner sidewall surface or the outer sidewall surface, so that the manifold structure and the thermally conductive base structure may be threadably attached. In this manner, threaded attachment of the thermally conductive base structure and manifold structure within the recess in the manifold structure beneficially both attaches the base structure to the manifold structure, and form a double, fluid-tight seal between the manifold structure and the thermally conductive base structure (that is, via the sealing member and the threads, assuming the threads are tapered or a thread sealer is used). In the threaded attachment configuration, the sidewall of the thermally conductive base structure is circular-shaped to facilitate the threaded attachment. Note that other attachment approaches could also be employed, and are described below.

Advantageously, by recessing the thermally conductive base structure at least partially within the manifold structure, both the attachment of the two structures together and the sealing of the two structures together is achieved in a more efficient and effective manner, resulting in a potentially smaller overall size for the heat sink assembly, and thus, reduced cost of manufacture.

Advantageously, with the liquid-cooled heat sink assembly summarized above, various coolant-carrying compartment configurations may be provided, for instance, with different liquid coolant flow patterns through the coolant-carrying compartment(s), as desired for a particular application. For example, liquid coolant may be introduced into the coolant-carrying compartment to impinge upon the base plate of the thermally conductive base structure in a central region of the compartment, and then bifurcate to flow outwards towards opposite peripheral regions thereof, before exiting the coolant-carrying compartment. Alternatively, the liquid coolant flow may be introduced at one side of the coolant-carrying compartment and flow substantially parallel to the main heat transfer surface through the compartment, to another side of the coolant-carrying compartment, before exiting through the manifold structure. Further, various configurations of thermally conductive fins, such as thermally conductive plate fins or thermally conductive pin fins, may be employed within the coolant-carrying compartment to facilitate transfer of heat from the one or more components being cooled to the liquid coolant flowing through the liquid-cooled heat sink assembly.

In another aspect, an apparatus is provided herein which includes at least one electronic component to be cooled, and a liquid-cooled heat sink assembly coupled to the at least one electronic component to facilitate cooling of the electronic component(s). The liquid-cooled heat sink assembly includes: a thermally conductive base structure, having a sidewall surface and a main heat transfer surface, the main heat transfer surface to couple to the at least one electronic component to be cooled; a manifold structure attached to the thermally conductive base structure, with the thermally conductive base structure residing at least partially within a recess in the manifold structure, the manifold structure and the thermally conductive base structure together defining a coolant-carrying compartment through which liquid coolant flows, at least in part, in a direction substantially parallel to the main heat transfer surface of the thermally conductive base structure, and wherein at least one of the sidewall surface of the thermally conductive base structure or an opposing surface thereto of the manifold structure comprises a continuous groove; and a sealing member disposed, at least in part, within the continuous groove, the sealing member providing a fluid-tight seal between the thermally conductive base structure and the manifold structure. Note that this apparatus, and in particular, the liquid-cooled heat sink assembly thereof, also possesses the above-summarized advantages, and/or may be extended to include the above-summarized embodiments or enhancements.

In a further aspect, a method is provided which includes: providing a liquid-cooled heat sink assembly to cool at least one component. The liquid-cooled heat sink assembly includes: a thermally conductive base structure, having a sidewall surface and a main heat transfer surface, the main heat transfer surface to couple the at least one component to be cooled; a manifold structure attached to the thermally conductive base structure, with the thermally conductive base structure residing at least partially within a recess in the manifold structure, the manifold structure and the thermally conductive base structure together defining a coolant-carrying compartment through which liquid coolant flows, at least in part, in a direction substantially parallel to the main heat transfer surface of the thermally conductive base structure, and wherein at least one of the sidewall surface of the thermally conductive base structure or an opposing surface thereto of the manifold structure comprises a continuous groove; and a sealing member disposed, at least in part, within the continuous groove, the sealing member facilitating providing a fluid-tight seal between the thermally conductive base structure and the manifold structure. Note that this method, and in particular, the liquid-cooled heat sink assembly thereof, also possesses the above-summarized advantages, and/or may be extended to include the above-summarized embodiments or enhancements.

Advantageously, the combination of a sealing member engaging one sidewall surface, and the threaded fasteners being provided to engage the other sidewall surface, provides a securing force to the sealing members substantially parallel to the main heat transfer surface of the thermally conductive base structure. This facilitates a more compact heat sink assembly compared with a case, for instance, where the fasteners are oriented perpendicular to the main heat transfer surface. Further, the use of threaded fasteners allows for the force on the sealing members to be threadably adjusted, as desired. Also, with locking fasteners employed as described above, the thermally conductive base structure may assume various configurations, that is, other than circular-shaped.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method comprising:
   providing a liquid-cooled heat sink assembly to cool at least one component, the providing the liquid-cooled heat sink assembly comprising:
   providing a thermally conductive base structure having a sidewall surface and a main heat transfer surface, the main heat transfer surface to couple to the at least one component to be cooled;
   providing a manifold structure attached to the thermally conductive base structure, with the thermally conductive base structure residing at least partially within a recess in the manifold structure, the manifold structure and the thermally conductive base structure together defining a coolant-carrying compartment through which liquid coolant flows, at least in part, in a direction substantially parallel to the main heat transfer surface of the thermally conductive base structure, wherein at least one of the sidewall surface of the thermally conductive base structure or an opposing surface thereto of the manifold structure comprises a continuous groove; and
   providing a sealing member disposed, at least in part, within the continuous groove, the sealing member providing a fluid-tight seal between the thermally conductive base structure and the manifold structure.

2. The method of claim 1, wherein the sidewall surface of the thermally conductive base structure is oriented substantially perpendicular to the main heat transfer surface, and the thermally conductive base structure is fabricated of a metal and the manifold structure is fabricated of a plastic.

3. The method of claim 1, wherein the thermally conductive base structure comprises a base plate and a sidewall extending therefrom, the sidewall surface comprising, at least in part, a surface of the sidewall of the thermally conductive base structure.

4. The method of claim 3, wherein the sidewall of the thermally conductive base structure comprises an inner sidewall surface and an outer sidewall surface, the continuous groove being in one of the inner sidewall surface or the opposing surface thereto of the manifold structure.

5. The method of claim 4, wherein the liquid-cooled heat sink assembly further comprises threads on the outer sidewall surface of the thermally conductive base structure, wherein the manifold structure and the thermally conductive base structure are threadably attached, at least in part, via the threads.

6. The method of claim 3, wherein the sidewall of the thermally conductive base structure comprises an inner sidewall surface and an outer sidewall surface, the continuous groove being in one of the outer sidewall surface or the opposing surface thereto of the manifold structure, and wherein the liquid-cooled heat sink assembly further comprises threads on the inner sidewall surface of the thermally conductive base structure, wherein the manifold structure and the thermally conductive base structure are threadably attached, at least in part, via the threads.

7. The method of claim 3, wherein the sidewall of the thermally conductive base structure is circular, and the manifold structure and thermally conductive base structure are threadably attached.

8. The method of claim 3, wherein the manifold structure and the thermally conductive base structure are attached via multiple fasteners, with the sidewall of the thermally conductive base structure residing within the recess in the manifold structure, and the fasteners being oriented in a direction substantially parallel to the main heat transfer surface of the thermally conductive base structure.

9. The method of claim 8, wherein at least one fastener of the multiple fasteners extends through a portion of the manifold structure and engages a respective fastener notch in the sidewall of the thermally conductive base structure.

10. The method of claim 1, wherein providing the manifold structure further comprises:
  providing a coolant inlet and a coolant outlet; and
  providing at least one inlet orifice in fluid communication with the coolant inlet and the coolant-carrying compartment, and at least one outlet orifice in fluid communication with the coolant outlet and the coolant-carrying compartment, wherein the liquid coolant flows through the coolant inlet, the at least one inlet orifice, the coolant-carrying compartment, and the at least one outlet orifice, to the coolant outlet.

11. The method of claim 10, wherein the at least one inlet orifice comprises at least one inlet slot positioned over a central region of the coolant-carrying compartment and facilitating the liquid coolant flow into the coolant-carrying compartment in the central region thereof.

12. The method of claim 1, further comprising a plurality of thermally conductive fins disposed within the coolant-carrying compartment to facilitate transfer of heat from the thermally conductive base structure to the liquid coolant flowing through the coolant-carrying compartment.

\* \* \* \* \*